(12) United States Patent
Nagatani et al.

(10) Patent No.: US 11,573,484 B2
(45) Date of Patent: Feb. 7, 2023

(54) PROJECTOR

(71) Applicant: SEIKO EPSON CORPORATION, Tokyo (JP)

(72) Inventors: Kaname Nagatani, Matsumoto (JP); Osamu Katsuda, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/511,705

(22) Filed: Oct. 27, 2021

(65) Prior Publication Data

US 2022/0128892 A1    Apr. 28, 2022

(30) Foreign Application Priority Data

Oct. 27, 2020  (JP) .............................. JP2020-179865

(51) Int. Cl.
| | |
|---|---|
| *G03B 21/16* | (2006.01) |
| *H04N 9/31* | (2006.01) |
| *G03B 21/14* | (2006.01) |
| *H05K 7/20* | (2006.01) |

(52) U.S. Cl.
CPC ........... *G03B 21/16* (2013.01); *G03B 21/145* (2013.01); *H04N 9/3144* (2013.01); *H05K 7/20309* (2013.01); *H05K 7/20318* (2013.01)

(58) Field of Classification Search
CPC ..... G03B 21/16; G03B 21/145; H04N 9/3144
See application file for complete search history.

(56) References Cited

U.S. PATENT DOCUMENTS

| | | | |
|---|---|---|---|
| 6,428,170 B1 | 6/2002 | Haba | |
| 7,993,009 B2 * | 8/2011 | Tsuchiya | G02F 1/133385 361/698 |
| 8,251,513 B2 * | 8/2012 | Itsuki | G03B 21/16 353/54 |
| 9,261,761 B2 | 2/2016 | Kuriaki | |
| 10,041,716 B2 | 8/2018 | Lee | |
| 10,866,496 B1 | 12/2020 | Nagatani et al. | |
| 2006/0285331 A1 * | 12/2006 | Wang | F21S 9/037 348/E5.142 |

(Continued)

FOREIGN PATENT DOCUMENTS

| | | |
|---|---|---|
| JP | 2000-298311 | 10/2000 |
| JP | 2009-122385 | 12/2009 |

(Continued)

*Primary Examiner* — Bao-Luan Q Le
(74) *Attorney, Agent, or Firm* — Dority & Manning, P.A.

(57) ABSTRACT

A projector includes a first cooling target, a cooling device, and an exterior housing that houses the first cooling target and the cooling device. The cooling device includes a first compressor configured to compress working fluid, a condenser configured to condense the working fluid, a first expander configured to decompress the working fluid, a first evaporator configured to change the working fluid to the working fluid in the gas phase with heat transferred from the first cooling target, a first connection pipe configured to lead the working fluid discharged from the first expander to the first evaporator, a second connection pipe configured to lead the working fluid discharged from the first evaporator to the first compressor, and a first case configured to seal the first expander, the first connection pipe, the first evaporator, and the second connection pipe on an inside.

14 Claims, 11 Drawing Sheets

(56) References Cited

U.S. PATENT DOCUMENTS

| | | | |
|---|---|---|---|
| 2008/0030688 A1* | 2/2008 | Lee | G03B 21/16 353/54 |
| 2008/0236190 A1* | 10/2008 | Tsuchiya | G03B 21/16 62/468 |
| 2008/0236191 A1 | 10/2008 | Tsuchiya | |
| 2009/0266098 A1* | 10/2009 | Nishijima | G03B 21/16 62/513 |
| 2010/0045940 A1* | 2/2010 | Takagi | G03B 21/16 353/54 |
| 2010/0066980 A1* | 3/2010 | Tsuchiya | H04N 9/3105 353/57 |
| 2010/0118279 A1* | 5/2010 | Itsuki | H04N 9/3144 353/54 |
| 2010/0302463 A1 | 12/2010 | Matsumoto | |
| 2010/0315600 A1* | 12/2010 | Nishimura | F21V 29/67 353/57 |
| 2011/0019160 A1* | 1/2011 | Kitano | G03B 21/16 353/57 |
| 2011/0032489 A1 | 2/2011 | Kimoto | |
| 2011/0037954 A1 | 2/2011 | Tsuchiya | |
| 2011/0211166 A1 | 9/2011 | Kawano | |
| 2012/0023978 A1 | 2/2012 | Chae | |
| 2012/0023980 A1 | 2/2012 | Lee | |
| 2012/0023981 A1 | 2/2012 | Chae | |
| 2012/0312034 A1 | 12/2012 | Oh | |
| 2013/0340454 A1 | 12/2013 | Kim | |
| 2015/0040591 A1 | 2/2015 | Lim | |
| 2015/0198869 A1 | 7/2015 | Kuriaki | |
| 2016/0215771 A1 | 7/2016 | Hu | |
| 2016/0356537 A1 | 12/2016 | Chae | |
| 2017/0219254 A1 | 8/2017 | Sul | |
| 2019/0168582 A1 | 6/2019 | Sun | |
| 2020/0296859 A1 | 9/2020 | Takagi | |

FOREIGN PATENT DOCUMENTS

| | | |
|---|---|---|
| JP | 2010-072592 A | 4/2010 |
| JP | 2015-132659 | 7/2015 |
| JP | 2021-032955 | 3/2021 |

* cited by examiner

PROJECTOR

The present application is based on, and claims priority from JP Application Serial Number 2020-179865, filed Oct. 27, 2020, the disclosure of which is hereby incorporated by reference herein in its entirety.

BACKGROUND

1. Technical Field

The present disclosure relates to a projector.

2. Related Art

There has been known a projector including an indoor unit that is disposed in a room and projects a video and an outdoor unit that is disposed outside the room (see, for example, JP-A-2015-132659 (Patent Literature 1)).

In the projector described in Patent Literature 1, the indoor unit includes RGB laser clusters, an optical combiner, and a projection lens and includes RGB laser absorbers, a first coolant pipe, a drain pipe, and an electronic expansion valve. The outdoor unit includes a second coolant pipe, a cooling device, and a coolant heating heater. A coolant pipe connecting one end of the first coolant pipe and one end of the second coolant pipe and connecting the other end of the first coolant pipe and the other end of the second coolant pipe and a communication line are disposed between the indoor unit and the outdoor unit.

In the projector, the electronic expansion valve, the G laser heat absorber, the B laser heat absorber, and the R laser heat absorber are connected in series in this order via the first coolant pipe.

The second coolant pipe forms an annular coolant path in conjunction with the first coolant pipe via the coolant pipe. A coolant circulates to one end of the electronic expansion valve, the laser heat absorbers, the coolant heating heater, a coolant compressor and a condenser of the cooling device, and the other end of the electronic expansion valve in this order.

The coolant compressor compresses a coolant gas to thereby raise the coolant gas in temperature and pressure. The condenser performs heat exchange of the coolant gas raised in the temperature and the pressure with outdoor air caused to flow in from the outside of the outdoor unit by a fan to thereby change the coolant gas to a high-pressure liquid coolant.

The electronic expansion valve decompresses the high-pressure liquid coolant and changes the high-pressure liquid coolant to a liquid coolant that easily vaporizes. The electronic expansion valve controls a decompression amount of the coolant in the first coolant pipe to thereby control an evaporation temperature of the coolant and cools the laser heat absorbers with a latent heat effect of the coolant.

If the coolant flows into the coolant compressor in a state in which the coolant is not completely vaporized, an adverse effect occurs in the coolant compressor. Therefore, the coolant caused to flow into the coolant compressor is heated by the coolant heating heater.

With the configuration explained above, the temperature of the laser heat absorbers and the like is kept constant by the latent heat effect of the coolant in a portion from one end of the electronic expansion valve to the laser heat absorbers and the coolant heating heater in the coolant path. In this way, the cooling device is capable of cooling the laser heat absorbers and the RGB laser clusters to a certain constant temperature via the coolant circulating in the coolant path.

However, since the projector described in Patent Literature 1 includes the outdoor unit connected to the indoor unit via the coolant pipe and the communication line, setting of the projector is complicated.

SUMMARY

A projector modulates light emitted from a light source and projects the light. The projector includes: a first cooling target; a cooling device configured to cool the first cooling target; and an exterior housing configuring an exterior of the projector and housing the first cooling target and the cooling device. The cooling device includes: a first compressor configured to compress working fluid in a gas phase; a condenser configured to condense the working fluid in the gas phase compressed by the first compressor into the working fluid in a liquid phase; a first expander configured to decompress the working fluid in the liquid phase condensed by the condenser and change the working fluid in the liquid phase to the working fluid in a mixed phase of the liquid phase and the gas phase; a first evaporator configured to change the working fluid flowing from the first expander to the working fluid in the gas phase with heat transferred from the first cooling target and discharge the working fluid changed in the gas phase to the first compressor; a first connection pipe configured to lead the working fluid discharged from the first expander to the first evaporator; a second connection pipe configured to lead the working fluid discharged from the first evaporator to the first compressor; and a first case configured to seal the first expander, the first connection pipe, the first evaporator, and the second connection pipe on an inside.

DESCRIPTION OF EXEMPLARY EMBODIMENTS

First Embodiment

A first embodiment of the present disclosure is explained below with reference to the drawings.

Schematic Configuration of a Projector

Figure 1:
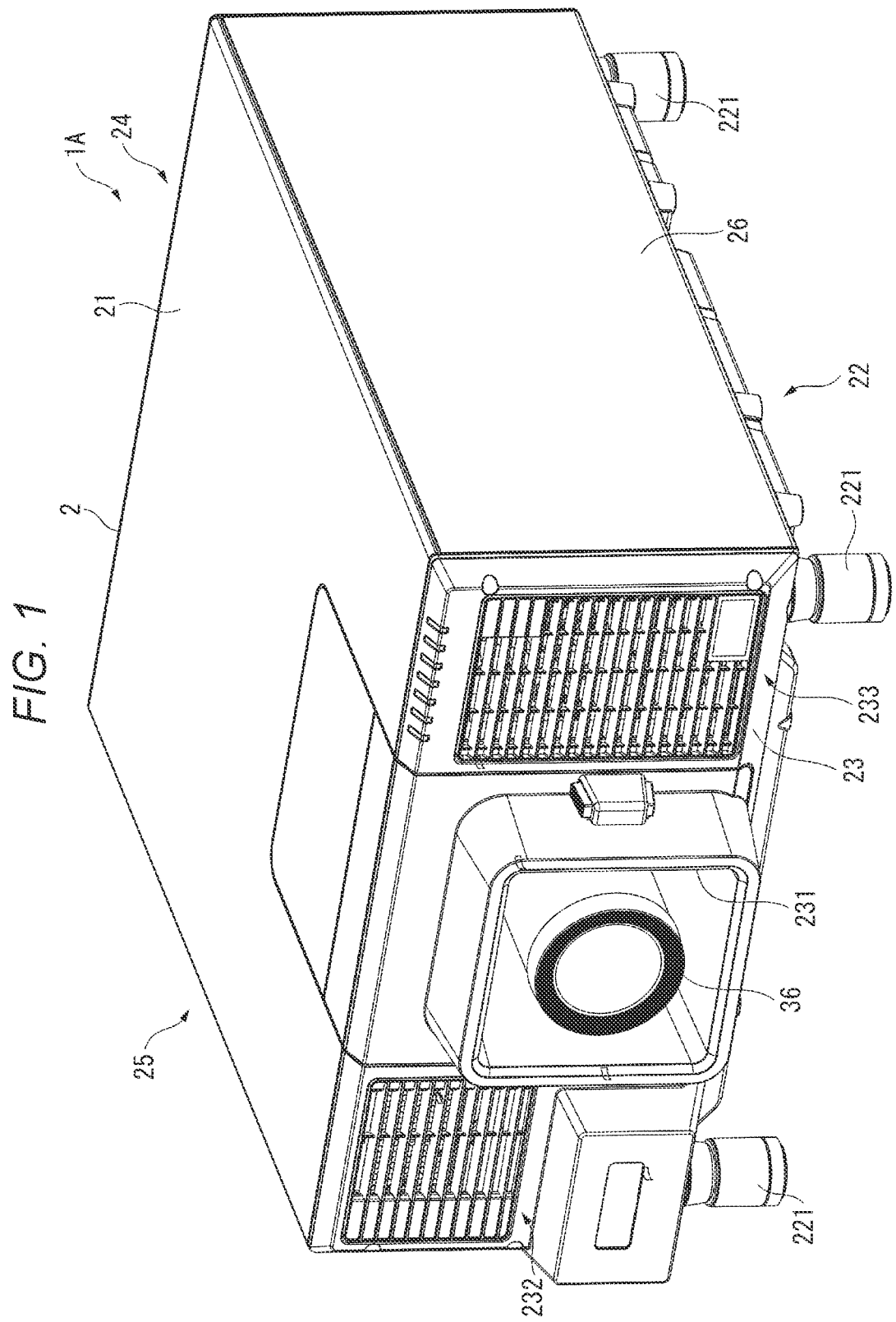
FIG. 1 is a perspective view showing an external appearance of a projector according to a first embodiment.

FIG. 1 is a perspective view showing an external appearance of a projector 1A according to this embodiment.

The projector 1A according to this embodiment is an image display device that modulates light emitted from a light source to form an image corresponding to image information and enlarges the formed image and projects the formed image onto a projection surface such as a screen. As shown in FIG. 1, the projector 1A includes an exterior housing 2 configuring an exterior of the projector 1A.

Configuration of the Exterior Housing

The exterior housing 2 includes a top surface 21, a bottom surface 22, a front surface 23, a rear surface 24, a left side surface 25, and a right side surface 26 and is formed in a substantially rectangular parallelepiped shape.

The bottom surface 22 includes a plurality of legs 221 that come into contact with a setting surface on which the projector 1A is placed.

The front surface 23 is located on an image projection side in the exterior housing 2. The front surface 23 includes an opening 231 that exposes a part of a projection optical device 36 explained below. An image projected by the projection optical device 36 passes through the opening 231. The front surface 23 includes an exhaust port 232 and an introduction port 233 in positions across the opening 231. The exhaust port 232 is located on the left side surface 25 side in the front surface 23 and discharges, to the outside of the exterior housing 2, a cooling gas that has cooled a cooling target in the projector 1A. The introduction port 233 is located on the right side surface 26 side in the front surface 23 and introduces gas such as air outside the exterior housing 2 to the inside of the exterior housing 2 as a cooling gas.

Internal Configuration of the Projector

Figure 2:
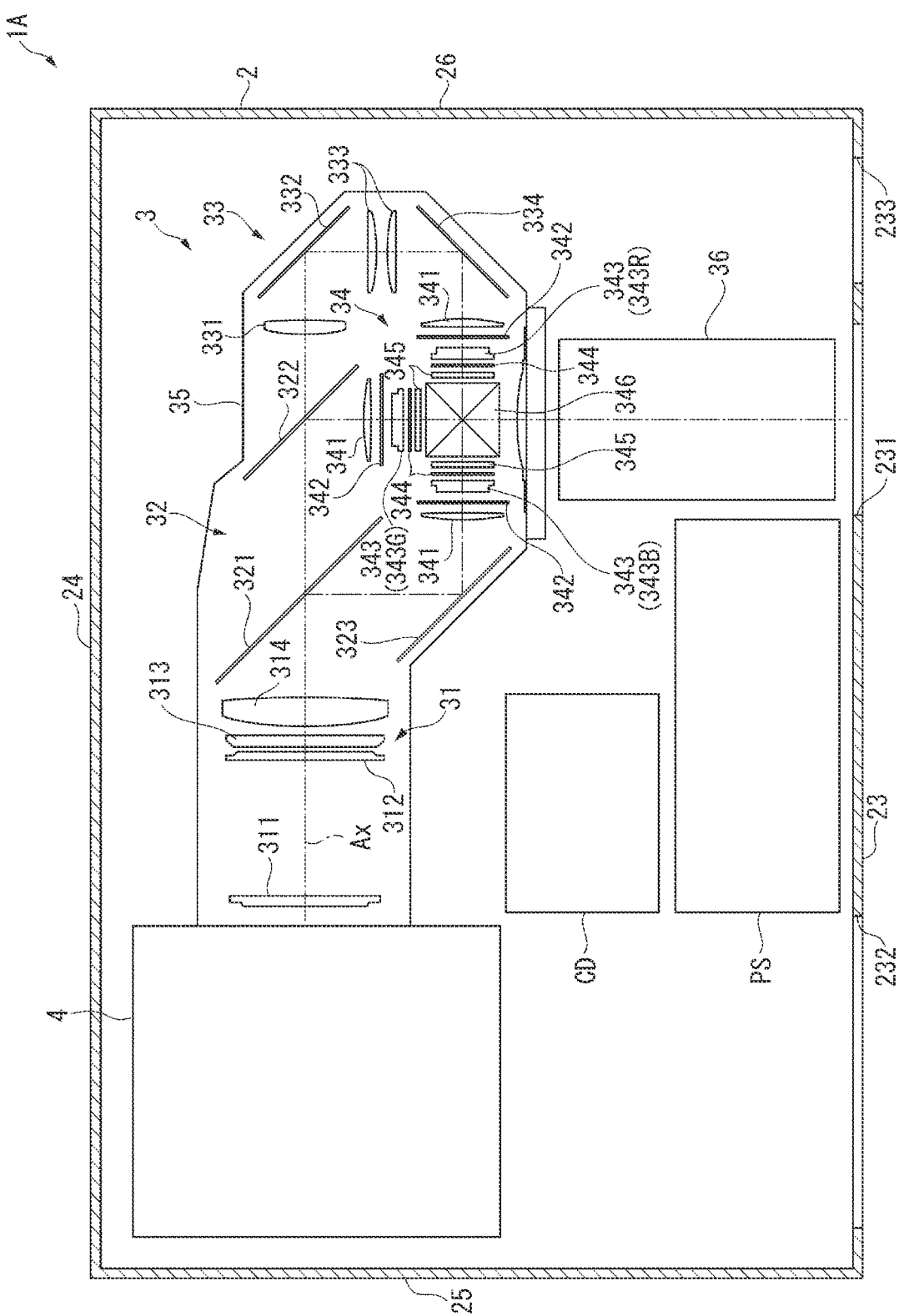
FIG. 2 is a schematic diagram showing an internal configuration of the projector according to the first embodiment.

FIG. 2 is a schematic diagram showing an internal configuration of the projector 1A.

As shown in FIG. 2, the projector 1A further includes an image projection device 3, a power supply device PS, and a control device CD. The image projection device 3, the power supply device PS, and the control device CD are housed in the exterior housing 2. Besides, although not shown in FIG. 2, the projector 1A includes a first cooling target CT1 and a cooling device 5A (see FIG. 4).

The power supply device PS transforms a voltage of electric power supplied from the outside and supplies the transformed electric power to electronic components of the projector 1A.

The control device CD controls the operation of the projector 1A. As the control device CD, for example, a circuit board mounted with an integrated circuit can be illustrated.

Configuration of the Image Projection Device

The image projection device 3 forms an image corresponding to image information input from the control device CD and projects the formed image. The image projection device 3 includes a light source device 4, a uniformizing system 31, a color separator 32, a relay system 33, an image forming system 34, an optical component housing 35, and a projection optical device 36.

The light source device 4 emits illumination light. The configuration of the light source device 4 is explained in detail below.

The uniformizing system 31 uniformizes the illumination light emitted from the light source device 4. The uniformized illumination light illuminates modulation regions of light modulation devices 343 explained below of the image forming system 34 through the color separator 32 and the relay system 33. The uniformizing system 31 includes two lens arrays 311 and 312, a polarization conversion element 313, and a superimposing lens 314.

The color separator 32 separates light made incident from the uniformizing system 31 into color lights of red, green, and blue. The color separator 32 includes two dichroic mirrors 321 and 322 and a reflection mirror 323 that reflects the blue light separated by the dichroic mirror 321.

The relay system 33 is provided in an optical path of the red light longer than optical paths of the other color lights and suppresses a loss of the red light. The relay system 33 includes an incident side lens 331, a relay lens 333, and reflection mirrors 332 and 334. In this embodiment, the relay system 33 is provided on the optical path of the red light. However, not only this, but, for example, the color light having the optical path longer than the optical paths of the other color lights may be the blue light and the relay system 33 may be provided on the optical path of the blue light.

The image forming system 34 modulates the color lights of red, green, and blue made incident thereon and combines the modulated color lights to form an image. The image forming system 34 includes three field lenses 341, three incident-side polarizing plates 342, three light modulation devices 343, three viewing angle compensation plates 344, and three emission-side polarizing plates 345 provided according to the incident color lights and one color combiner 346.

The light modulation devices 343 modulate, according to image information, light emitted from the light source device 4. The light modulation devices 343 include a light modulation device for red light 343R, a light modulation device for green light 343G, and a light modulation device for blue light 343B. In this embodiment, the light modulation devices 343 are configured by transmission-type liquid crystal panels. Liquid crystal light valves are configured by the incident-side polarizing plates 342, the light modulation devices 343, and the emission-side polarizing plates 345.

The color combiner 346 combines the color lights modulated by the light modulation devices 343B, 343G, and 343R to form an image. In this embodiment, the color combiner 346 is configured by a cross dichroic prism. However, not only this, but the color combiner 346 can also be configured by, for example, a plurality of dichroic mirrors.

The optical component housing 35 houses the components 31 to 34 explained above on the inside. An illumination optical axis Ax, which is an optical axis in design, is set in the image projection device 3. The optical component housing 35 holds the components 31 to 34 in predetermined positions in the illumination optical axis Ax. The light source device 4 and the projection optical device 36 are disposed in predetermined positions in the illumination optical axis Ax.

The projection optical device 36 is a projection lens that enlarges an image made incident from the image forming system 34 and projects the image onto a projection surface. That is, the projection optical device 36 projects lights modulated by the light modulation devices 343B, 343G, and 343R. The projection optical device 36 is configured as, for example, a group lens in which a plurality of lenses are housed in a tubular lens barrel.

Configuration of the Light Source Device

Figure 3:
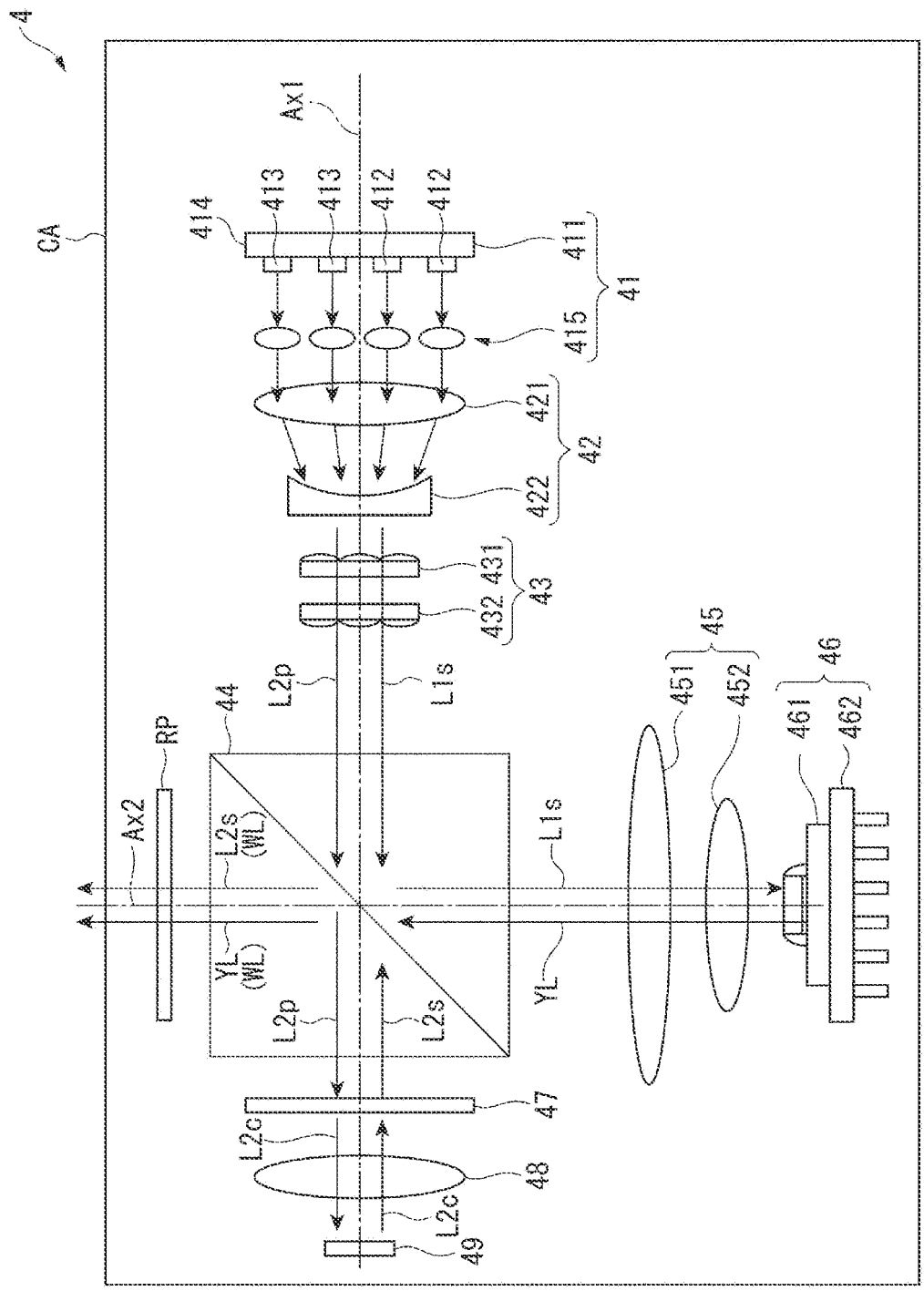
FIG. 3 is a schematic diagram showing the configuration of a light source device in the first embodiment.

FIG. 3 is a schematic diagram showing the configuration of the light source device 4.

The light source device 4 emits illumination light to the uniformizing system 31. The light source device 4 includes, as shown in FIG. 3, a light source housing CA, a light source system 41 housed in the light source housing CA, an afocal optical element 42, a homogenizer optical element 43, a polarization separator 44, a first condensing element 45, a wavelength conversion element 46, a first phase difference element 47, a second condensing element 48, a diffuser 49, and a second phase difference element RP.

The light source housing CA is configured as a sealed housing into which dust and the like less easily intrude.

The light source system 41, the afocal optical element 42, the homogenizer optical element 43, the polarization separator 44, the first phase difference element 47, the second condensing element 48, and the diffuser 49 are disposed on an illumination optical axis Ax1 set in the light source device 4.

The wavelength conversion element 46, the first condensing element 45, the polarization separator 44, and the second phase difference element RP are set in the light source device 4 and disposed on an illumination optical axis Ax2 orthogonal to the illumination optical axis Ax1. The illumination optical axis Ax2 coincides with the illumination optical axis Ax in the position of the lens array 311. In other words, the illumination optical axis Ax2 is set on an extended line of the illumination optical axis Ax.

Configuration of the Light Source System

The light source system 41 includes a light source 411 that emits light and a collimator lens 415.

The light source 411 includes a plurality of first semiconductor lasers 412, a plurality of second semiconductor lasers 413, and a supporting member 414.

The first semiconductor lasers 412 emit blue light $L1s$ of s-polarized light, which is excitation light. The blue light $L1s$ is, for example, laser light, a peak wavelength of which is 440 nm. The blue light $L1s$ emitted from the first semiconductor lasers 412 is made incident on the wavelength conversion element 46.

The second semiconductor lasers 413 emit blue light $L2p$ of p-polarized light. The blue light $L2p$ is, for example, laser light, a peak wavelength of which is 460 nm. The blue light $L2p$ emitted from the second semiconductor lasers 413 is made incident on the diffuser 49.

The supporting member 414 supports the plurality of first semiconductor lasers 412 and the plurality of second semiconductor lasers 413 respectively disposed in array shapes on a plane orthogonal to the illumination optical axis Ax1.

The blue light $L1s$ emitted from the first semiconductor lasers 412 and the blue light $L2p$ emitted from the second semiconductor lasers 413 are converted into parallel light beams by the collimator lens 415 and made incident on the afocal optical element 42.

In this embodiment, the light source 411 is configured to emit the blue light $L1s$ of the s-polarized light and the blue light $L2p$ of the p-polarized light. However, not only this, but the light source 411 may be configured to emit blue lights, which are liner polarized lights, polarization directions of which are the same. In this case, a phase difference element that changes incident one kind of linear polarized light to lights including the s-polarized light and the p-polarized light only has to be disposed between the light source system 41 and the polarization separator 44.

Configurations of the Afocal Optical Element and the Homogenizer Optical Element The afocal optical element 42 adjusts light beam diameters of the blue lights $L1s$ and $L2p$ made incident from the light source system 41 and makes the blue lights $L1s$ and $L2p$ incident on the homogenizer optical element 43. The afocal optical element 42 is configured by a lens 421 that condenses incident light and a lens 422 that collimates light beams condensed by the lens 421.

The homogenizer optical element 43 uniformizes illuminance distributions of the blue lights $L1s$ and $L2p$. The homogenizer optical element 43 is configured by a pair of multi-lens arrays 431 and 432. A diffusion element that diffuses incident light may be provided instead of the homogenizer optical element 43.

Configuration of the Polarization Separator

The blue lights $L1s$ and $L2p$ having passed through the homogenizer optical element 43 are made incident on the polarization separator 44.

The polarization separator 44 is a prism-type polarization beam splitter and separates a s-polarized light component and a p-polarized light component included in incident light. Specifically, the polarization separator 44 reflects the s-polarized light component and allows the p-polarized light component to pass. The polarization separator 44 has a color separation characteristic for allowing light having a predetermined wavelength or more to pass irrespective of whether a polarized component of the light is the s-polarized light component or the p-polarized light component. Therefore, the blue light $L1s$ of the s-polarized light is reflected by the polarization separator 44 and made incident on the first condensing element 45. On the other hand, the blue light $L2p$ of the p-polarized light passes through the polarization separator 44 and is made incident on the first phase difference element 47.

Configuration of the First Condensing Element

The first condensing element 45 condenses, on the wavelength conversion element 46, the blue light $L1s$ reflected by the polarization separator 44. The first condensing element 45 collimates fluorescent light YL made incident from the wavelength conversion element 46. In an example shown in FIG. 3, the first condensing element 45 is configured by two lenses 451 and 452. However, the number of lenses configuring the first condensing element 45 may be any number.

Configuration of the Wavelength Conversion Element

The wavelength conversion element 46 is excited by light made incident thereon and generates the fluorescent light YL, a wavelength of which is longer than a wavelength of the incident light, and emits the fluorescent light YL to the first condensing element 45. In other words, the wavelength conversion element 46 converts the wavelength of the incident light and emits converted light. The fluorescent light YL generated by the wavelength conversion element 46 is, for example, light, a peak wavelength of which is 500 to 700 nm. The wavelength conversion element 46 includes a wavelength converter 461 and a heat radiator 462.

Although not shown, the wavelength converter 461 includes a wavelength conversion layer and a reflection layer. The wavelength conversion layer includes a phosphor that diffuses and emits the fluorescent light YL, which is non-polarized light obtained by converting a wavelength of the blue light $L1s$ made incident thereon. The reflection layer reflects the fluorescent light YL made incident from the wavelength conversion layer to the first condensing element 45 side.

The heat radiator 462 is provided on a surface on the opposite side of the light incident side in the wavelength converter 461 and radiates heat generated in the wavelength converter 461.

The fluorescent light YL emitted from the wavelength conversion element 46 passes through the first condensing element 45 along the illumination optical axis Ax2 and, thereafter, is made incident on the polarization separator 44 having the color separation characteristic explained above. The fluorescent light YL passes through the polarization separator 44 along the illumination optical axis Ax2 and is made incident on the second phase difference element RP.

The wavelength conversion element 46 may be configured to be rotated around a rotation axis parallel to the illumination optical axis Ax2 by a rotation device such as a motor.

Configurations of the First Phase Difference Element and the Second Condensing Element The first phase difference element 47 is disposed between the polarization separator 44 and the second condensing element 48. The first phase difference element 47 converts the flue light L2p having passed through the polarization separator 44 into blue light L2c of circularly polarized light. The blue light L2c is made incident on the second condensing element 48.

The second condensing element 48 condenses, on the diffuser 49, the blue light L2c made incident from the first phase difference element 47. The second condensing element 48 collimates the blue light L2c made incident from the diffuser 49. The number of lenses configuring the second condensing element 48 can be changed as appropriate.

Configuration of the Diffuser

The diffuser 49 reflects, at the same diffusion angle as a diffusion angle of the fluorescent light YL emitted from the wavelength conversion element 46, and diffuses the blue light L2c made incident thereon. As the configuration of the diffuser 49, a configuration including a reflection plate that causes Lambertian reflectance of the incident blue light L2c and a rotation device that rotates the reflection plate around a rotation axis parallel to the illumination light axis Ax1 can be illustrated.

The blue light L2c reflected by the diffuser 49 passes through the second condensing element 48 and, thereafter, is made incident on the first phase difference element 47. When being reflected by the diffuser 49, the blue light L2c is converted into circularly polarized light, a rotation direction of which is the opposite direction of a rotation direction of the blue light L2c. Accordingly, the blue light L2c made incident on the first phase difference element 47 via the second condensing element 48 is converted into blue light L2s of s-polarized light rather than the blue light L2p of the p-polarized light made incident on the first phase difference element 47 from the polarization separator 44. The blue light L2s is reflected by the polarization separator 44 and made incident on the second phase difference element RP. That is, light made incident on the second phase difference element RP from the polarization separator 44 is white light in which the blue light L2s and the fluorescent light LY are mixed.

Configuration of the Second Phase Difference Element

The second phase difference element RP converts the white light made incident from the polarization separator 44 into light in which s-polarized light and p-polarized light are mixed. White illumination light WL converted in this way is made incident on the uniformizing system 31 explained above.

Configuration of the Cooling Device

Figure 4:
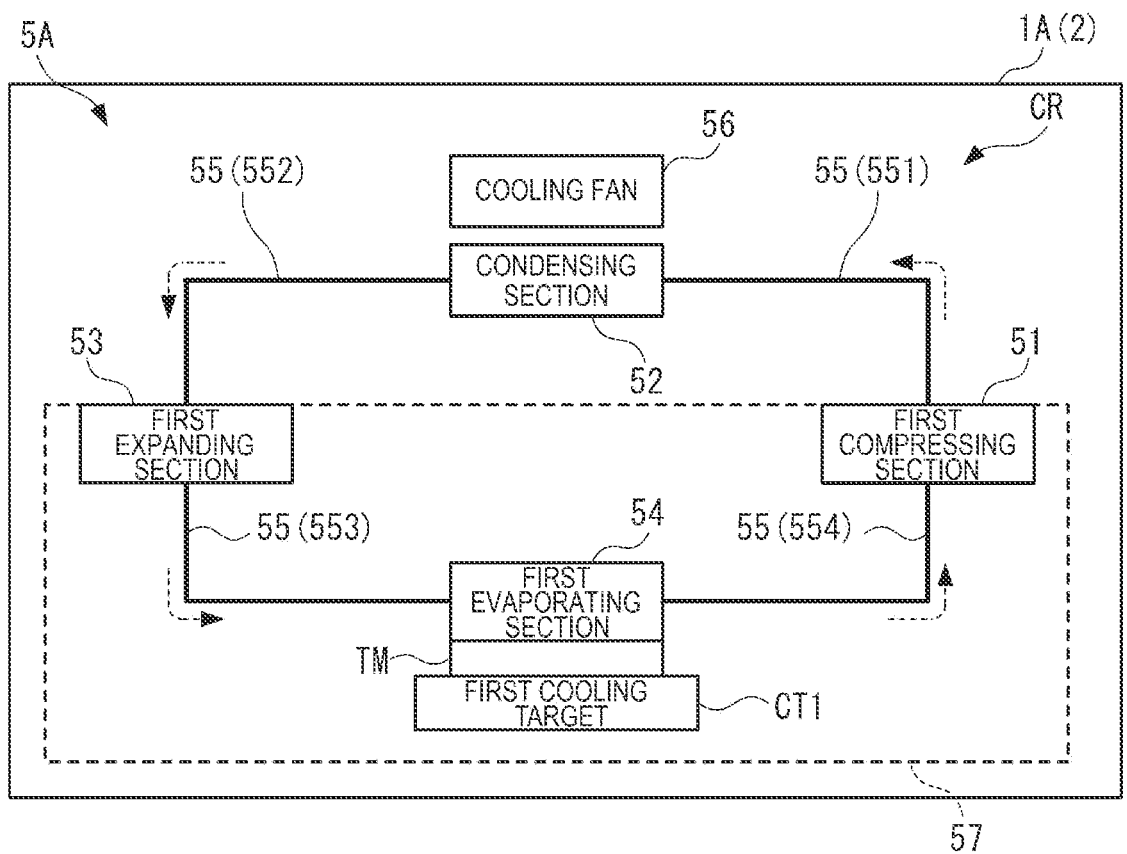
FIG. 4 is a schematic diagram showing a cooling device in the first embodiment.

FIG. 4 is a schematic diagram showing the cooling device 5A. In FIG. 4, a flowing direction of working fluid is indicated by a dotted line arrow.

The cooling device 5A cools the first cooling target CT1 configuring the projector 1A. Specifically, the cooling device 5A circulates working fluid, a phase of which changes between a liquid phase and a gas phase, to cool the first cooling target CT1. As the first cooling target CT1, at least one of the light source 411, the wavelength conversion element 46, and the light modulation devices 343 can be illustrated. In the cooling device 5A according to this embodiment, the first cooling target CT1 is the light source 411. As shown in FIG. 4, the cooling device 5A and the first cooling target CT1 are housed in the exterior housing 2.

The cooling device 5A includes a first compressor 51, a condenser 52, a first expander 53, a first evaporator 54, a plurality of pipes 55, a cooling fan 56, and a first case 57.

Configuration of the Plurality of Pipes

The plurality of pipes 55 are tubular members that annularly connect the first compressor 51, the condenser 52, the first expander 53, and the first evaporator 54. The working fluid flows on the insides of the plurality of pipes 55. The plurality of pipes 55 include a first pipe 551, a second pipe 552, a third pipe 553, and a fourth pipe 554.

The first pipe 551 connects the first compressor 51 and the condenser 52.

The second pipe 552 connects the condenser 52 and the first expander 53.

The first pipe 551 and the second pipe 552 are formed of a material, for example, metal having relatively high resistance in strength against working fluid having relatively high pressure.

The third pipe 553 is equivalent to the first connection pipe. The third pipe 553 connects the first expander 53 and the first evaporator 54 and leads the working fluid discharged from the first expander 53 to the first evaporator 54.

The fourth pipe 554 is equivalent to the second connection pipe. The fourth pipe 554 connects the first evaporator 54 and the first compressor 51 and leads the working fluid discharged from the first evaporator 54 to the first compressor 51.

In this embodiment, relatively low-pressure working fluid flows to the third pipe 553 and the fourth pipe 554. Therefore, the third pipe 553 and the fourth pipe 554 are formed of a material, for example, metal or resin with which resistance in strength against the relatively low-pressure working fluid is secured.

Configuration of the First Compressor

The first compressor 51 compresses working fluid in a gas phase. That is, the first compressor 51 compresses the working fluid in the gas phase flowing into the first compressor 51 from the fourth pipe 554 to thereby raise the working fluid in the gas phase in temperature and pressure. The first compressor 51 discharges the working fluid in the gas phase raised in temperature and pressure to the condenser 52 via the first pipe 551.

Configuration of the Condenser

The condenser 52 is connected to the first compressor 51 via the first pipe 551. The condenser 52 condenses the working fluid in the gas phase compressed by the first compressor 51, that is, the working fluid in the gas phase raised in temperature and pressure into the working fluid in a liquid phase. Specifically, the condenser 52 performs heat exchange between the compressed working fluid in the gas phase and a cooling gas introduced into the inside of the exterior housing 2 from the outside and caused to flow to the condenser 52 by the cooling fan 56 to thereby condense the working fluid in the gas phase into high-pressure working fluid in the liquid phase. The condenser 52 discharges the condensed working fluid to the first expander 53 via the second pipe 552.

Configuration of the First Expander

The first expander 53 is a decompressor and is connected to the condenser 52 via the second pipe 552. The working fluid in the liquid phase condensed by the condenser 52 flows into the first expander 53.

The first expander 53 decompresses the working fluid in the liquid phase condensed by the condenser 52 and changes the working fluid in the liquid phase to the working fluid in a mixed phase of the liquid phase and the gas phase. That is, the first expander 53 lowers the temperature of the working fluid. The first expander 53 discharges the working fluid in the mixed phase of the liquid phase and the gas phase to the first evaporator 54 via the third pipe 553.

The first expander 53 can be configured by, for example, an expansion valve capable of controlling an evaporation temperature of the working fluid in the liquid phase, more specifically, an electronic expansion valve and can be configured by a capillary tube.

Configuration of the First Evaporator

The first evaporator 54 is connected to the first expander 53 via the third pipe 553. The working fluid in the mixed phase of the liquid phase and the gas phase flows into the first evaporator 54 from the first expander 53 via the third pipe 553.

The first evaporator 54 is connected to the first cooling target CT1 via a heat transfer member TM. The heat transfer member TM is a metal member having thermal conductivity. That is, the first evaporator 54 is connected to the first cooling target CT1 to be capable of transferring heat.

The first evaporator 54 evaporates, with heat transferred from the first cooling target CT1 via the heat transfer member TM, the working fluid in the liquid phase flowing into the first evaporator 54 from the first expander 53 and changes the working fluid in the liquid phase to the working fluid in the gas phase. The first evaporator 54 discharges the changed working fluid in the gas phase to the first compressor 51 via the fourth pipe 554. Consequently, the heat of the first cooling target CT1 is consumed and the first cooling target CT1 is cooled.

For example, when the first cooling target CT1 is the light source 411, heat generated by the plurality of first semiconductor lasers 412 and the plurality of second semiconductor lasers 413 is transferred to the first evaporator 54 via the supporting member 414 and the heat transfer member TM. The working fluid in the liquid phase changes to the working fluid in the gas phase with the transferred heat, whereby the semiconductor lasers 412 and 413 are cooled. The same applies when the first cooling target CT1 is the wavelength conversion element 46, the light modulation devices 343, and the like. The heat transfer member TM may be absent.

In this way, the cooling device 5A includes a circulation path CR of the working fluid that flows in the first compressor 51, the first pipe 551, the condenser 52, the second pipe 552, the first expander 53, the third pipe 553, the first evaporator 54, and the fourth pipe 554 in order and flows into the first compressor 51 again. The circulation path CR cools the first cooling target CT1.

Configuration of the First Case

The first case 57 is a sealed housing that seals up the first expander 53, the third pipe 553 functioning as the first connection pipe, the first evaporator 54, and the fourth pipe 554 functioning as the second connection pipe on the inside. In this embodiment, the first case 57 further houses the first compressor 51 on the inside.

The temperature of the working fluid discharged from the first expander 53 and flowing into the first evaporator 54 via the third pipe 553 is lower than the temperature of the working fluid discharged from the first compressor 51 and flowing into the first expander 53 via the first pipe 551, the condenser 52, and the second pipe 552. That is, the temperature of the working fluid discharged from the first expander 53 and flowing into the first compressor 51 via the third pipe 553, the first evaporator 54, and the fourth pipe 554 is lower than the temperature of the working fluid discharged from the first compressor 51 and flowing into the first expander 53 via the condenser 52. Accordingly, depending on the temperature of an environment of use of the projector 1A, it is likely that dew condensation is caused in an exit of the working fluid in the first expander 53, the third pipe 553, the first evaporator 54, and the fourth pipe 554 by the low-temperature working fluid reaching from the first expander 53 to the first compressor 51. If dew condensation occurs in these components and moisture adheres to electronic components disposed near these components, it is likely that the electronic components break down.

On the other hand, it is conceivable to suppress occurrence of dew condensation by adjusting decompression in the first expander 53 and setting the temperature of the working fluid discharged from the first expander 53 to temperature assumed to not cause dew condensation even when the projector 1A is used.

However, if the temperature of the working fluid is adjusted in this way, although occurrence of dew condensation can be suppressed, it is difficult to further lower the temperature of the working fluid flowing into the first evaporator 54 from the first expander 53. Therefore, it is difficult to further improve cooling efficiency of the first cooling target CT1.

In contrast, in the cooling device 5A according to this embodiment, the first expander 53, the third pipe 553, the first evaporator 54, and the fourth pipe 554 are sealed up and housed in the first case 57. That is, the first expander 53, the third pipe 553, the first evaporator 54, and the fourth pipe 554 on a low temperature side are disposed on the inside of the first case 57. Since the first case 57 is assembled in a facility such as a factory in which humidity is controlled, the humidity in the first case 57 can be set lower than the humidity of the environment of use of the projector 1A.

In this way, the first expander 53, the third pipe 553, the first evaporator 54, and the fourth pipe 554 are sealed up in the first case 57 in which the humidity is lower than the humidity of the environment of use of the projector 1A. Consequently, even when the low-temperature working fluid is caused to flow into the first evaporator 54 from the first expander 53, it is possible to suppress dew condensation from occurring in the first case 57. Consequently, the temperature of the working fluid decompressed by the first expander 53 and flowing into the first evaporator 54 can be further lowered. Therefore, it is possible to further improve the cooling efficiency of the first cooling target CT1 cooled by the first evaporator 54.

In this embodiment, the first compressor 51 is sealed up in the first case 57. At an inflow end connected to the fourth pipe 554 in the first compressor 51, it is likely that dew condensation is easily caused by the working fluid flowing into the first compressor 51 from the first evaporator 54 via the fourth pipe 554. Accordingly, the dew condensation is suppressed from occurring in the first compressor 51 by sealing up the first compressor 51 as well in the first case 57.

However, not only this, but the first compressor 51 may not be sealed up and housed in the first case 57.

Effects of the First Embodiment

The projector 1A according to this embodiment explained above achieves effects described below.

The projector 1A modulates and projects light emitted from the light source 411. The projector 1A includes the first cooling target CT1, the cooling device 5A that cools the first cooling target CT1, and the exterior housing 2 that configures the exterior of the projector 1A and houses the first cooling target CT1 and the cooling device 5A.

The cooling device 5A includes the first compressor 51, the condenser 52, the first expander 53, the first evaporator 54, the third pipe 553 functioning as the first connection pipe, the fourth pipe 554 functioning as the second connection pipe, and the first case 57.

The first compressor 51 compresses working fluid in a gas phase. The condenser 52 condenses the working fluid in the gas phase compressed by the first compressor 51 into the working fluid in a liquid phase. The first expander 53 decompresses the working fluid in the liquid phase condensed by the condenser 52 and changes the working fluid in the liquid phase to the working fluid in a mixed phase of the liquid phase and the gas phase. The first evaporator 54 changes the working fluid caused to flow in from the first expander 53 to the working fluid in the gas phase with heat transferred from the first cooling target CT1 and discharges the changed working fluid in the gas phase to the first compressor 51. The third pipe 553 leads the working fluid discharged from the first expander 53 to the first evaporator 54. The fourth pipe 554 leads the working fluid discharged from the first evaporator 54 to the first compressor 51. The first case 57 seals up the first expander 53, the third pipe 553, the first evaporator 54, and the fourth pipe 554 on the inside.

With such a configuration, since the cooling device 5A is provided in the exterior housing 2 together with the first cooling target CT1, the projector 1A can be easily set compared with when a part of the cooling device 5A is provided on the outside of the exterior housing 2. The external appearance of the projector 1A can be made satisfactory. Besides, the projector 1A can be configured small. The projector 1A can be easily moved.

Further, since the humidity in the first case 57 is lower than the humidity of the environment of use of the projector 1A, it is possible to prevent dew condensation due to flowing of the low-temperature working fluid from easily occurring in the first expander 53, the third pipe 553, the first evaporator 54, and the fourth pipe 554 disposed in the first case 57. Therefore, it is possible to cause the working fluid having lower temperature to flow to the first evaporator 54 while preventing the electronic components from breaking down because moisture caused by the dew condensation adheres to the electronic components. Therefore, it is possible to improve cooling efficiency of the first cooling target CT1, heat of which is consumed by the first evaporator 54.

In the projector 1A, the first case 57 seals up the first compressor 51 on the inside.

With such a configuration, even when relatively low-temperature working fluid flows to the first compressor 51, it is possible to suppress dew condensation from occurring in the first compressor 51.

Since the first compressor 51 is sealed up on the inside of the first case 57, noise caused by vibration or the like of the first compressor 51 can be attenuated by the first case 57. Noise output to the outside of the projector 1A can be reduced.

In the projector 1A, the temperature of the working fluid discharged from the first expander 53 and flowing into the first compressor 51 via the third pipe 553, the first evaporator 54, and the fourth pipe 554 is lower than the temperature of the working fluid discharged from the first compressor 51 and flowing into the first expander 53 via the condenser 52. The first expander 53, the third pipe 553, the first evaporator 54, and the fourth pipe 554 on the low temperature side are disposed on the inside of the first case 57. The third pipe 553 is equivalent to the first connection pipe. The fourth pipe 554 is equivalent to the second connection pipe.

With such a configuration, since the first expander 53, the third pipe 553, the first evaporator 54, and the fourth pipe 554 on the low temperature side are disposed on the inside of the first case 57, occurrence of dew condensation can be effectively suppressed.

Second Embodiment

A second embodiment of the present disclosure is explained.

A projector according to this embodiment has the same configuration as the configuration of the projector 1A according to the first embodiment. However, the projector is different from the projector 1A in that the first cooling target CT1 is cooled by a cooling gas circulating in the first case 57. In the following explanation, the same or substantially the same portions as the portions explained above are denoted by the same reference numerals and signs and explanation of the portions is omitted.

Figure 5:
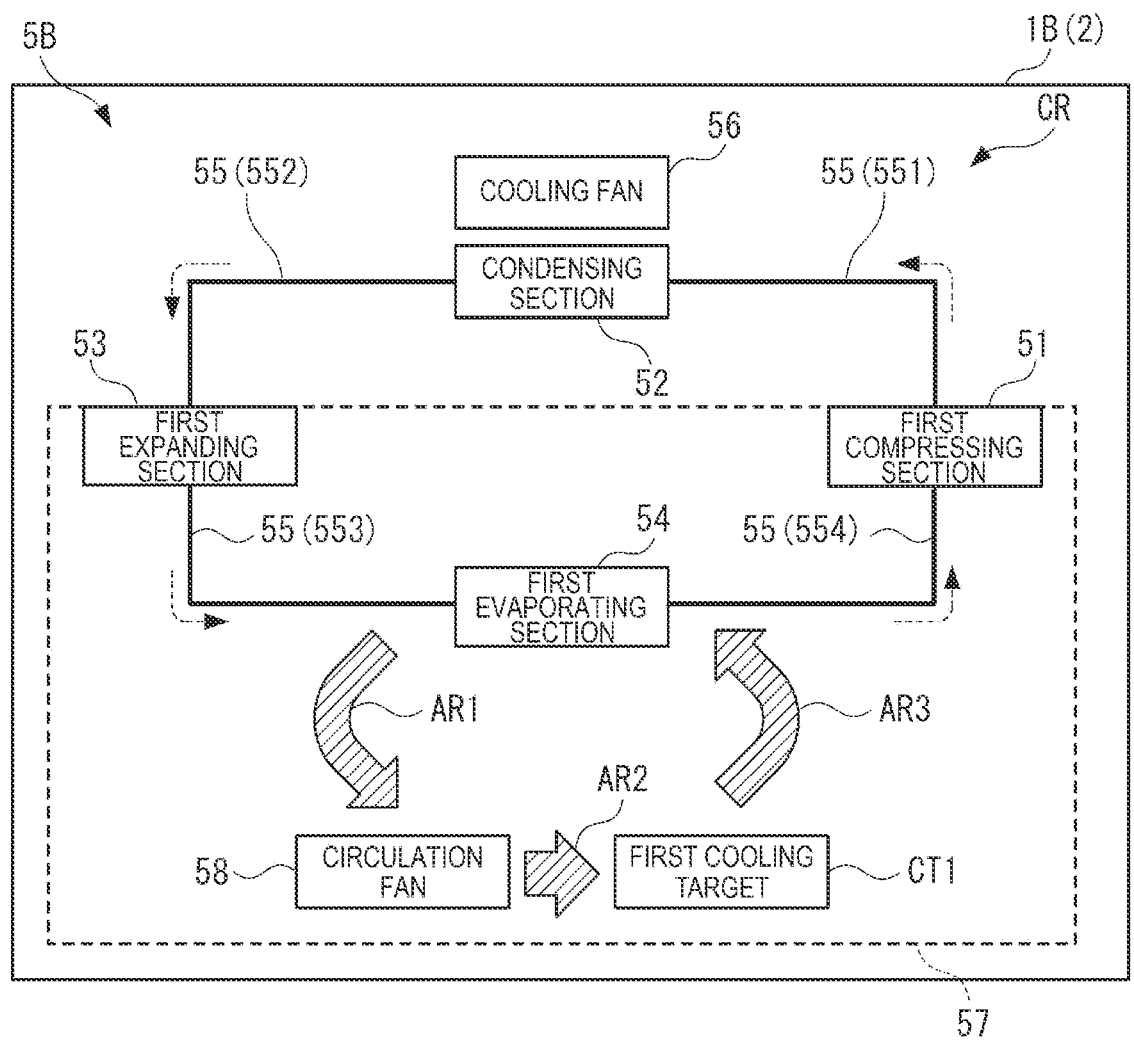
FIG. 5 is a schematic diagram showing a cooling device included in a projector according to a second embodiment.

FIG. 5 is a schematic diagram showing a cooling device 5B included in a projector 1B according to this embodiment.

The projector 1B according to this embodiment has the same configuration and the same function as the configuration and the function of the projector 1A according to the first embodiment except that the projector 1B includes the cooling device 5B shown in FIG. 5 instead of the cooling device 5A according to the first embodiment.

The cooling device 5B has the same configuration as the configuration of the cooling device 5A except that the cooling device 5B includes a circulation fan 58 instead of the heat transfer member TM. That is, the cooling device 5B further includes the circulation fan 58 besides the first compressor 51, the condenser 52, the first expander 53, the first evaporator 54, the pipes 55 (551 to 554), the cooling fan 56, and the first case 57.

The first case 57 seals up and houses the first expander 53, the third pipe 553 functioning as the first connection pipe, the first evaporator 54, the fourth pipe 554 functioning as the second connection pipe, the first compressor 51, the first cooling target CT1, and the circulation fan 58 on the inside.

The first cooling target CT1 is not connected to the first evaporator 54 via the heat transfer member TM but is provided to be separated from the first evaporator 54 in the first case 57.

The circulation fan 58 is equivalent to a first circulation fan. The circulation fan 58 is disposed on the inside of the first case 57 and circulates a cooling gas on the inside of the first case 57 to cool the first cooling target CT1. Specifically, the circulation fan 58 sucks the cooling gas cooled by the first evaporator 54 as indicated by an arrow AR1 in FIG. 5 and delivers the sucked cooling gas to the first cooling target CT1 as indicated by an arrow AR2. The cooling gas delivered to the first cooling target CT1 and having cooled the first cooling target CT1 flows to the first evaporator 54 as indicated by an arrow AR3 and is cooled by the first evaporator 54. In other words, the first evaporator 54 cools the cooling gas on the inside of the first case 57 and cools the first cooling target CT1.

In this way, in the cooling device 5B, the first cooling target CT1 is cooled by a circulation channel of the cooling gas provided on the inside of the first case 57.

Effects of the Second Embodiment

The projector 1B according to this embodiment explained above achieves effects described below besides the same effects as the effects of the projector 1A according to the first embodiment.

In the projector 1B, the first cooling target CT1 is disposed on the inside of the first case 57. The first evaporator 54 cools the cooling gas on the inside of the first case 57 and cools the first cooling target CT1.

With such a configuration, since the first cooling target CT1 is sealed up in the first case 57, it is possible to suppress dust and the like from adhering to the first cooling target CT1. It is possible to cool the entire first cooling target CT1 with the cooling gas cooled by the first evaporator 54 in the first case 57. Besides, when the first cooling target CT1 includes a plurality of components, for example, when the first cooling target CT1 is the light modulation device for red light 343R, the light modulation device for green light 343G, and the light modulation device for blue light 343B, the configuration of the cooling device 5B can be further simplified compared with when the first evaporator 54 is provided in each of the plurality of components.

In the projector 1B, the cooling device 5B includes a circulation fan 58 that is provided on the inside of the first case 57 and circulates the cooling gas on the inside of the first case 57 to cool the first cooling target CT1. The circulation fan 58 is equivalent to the first circulation fan.

With such a configuration, it is possible to cause the cooling gas circulated in the first case 57 by the circulation fan 58 and cooled by the first evaporator 54 to flow to the first cooling target CT1. Therefore, it is possible to improve cooling efficiency of the first cooling target CT1.

Third Embodiment

A third embodiment of the present disclosure is explained.

A projector according to this embodiment has the same configuration as the configuration of the projector 1A according to the first embodiment. However, the projector is different from the projector 1A in that the projector further includes a component for cooling a second cooling target CT2 different from the first cooling target CT1. In the following explanation, the same or substantially the same portions as the portions explained above are denoted by the same reference numerals and signs and explanation of the portions is omitted.

Figure 6:
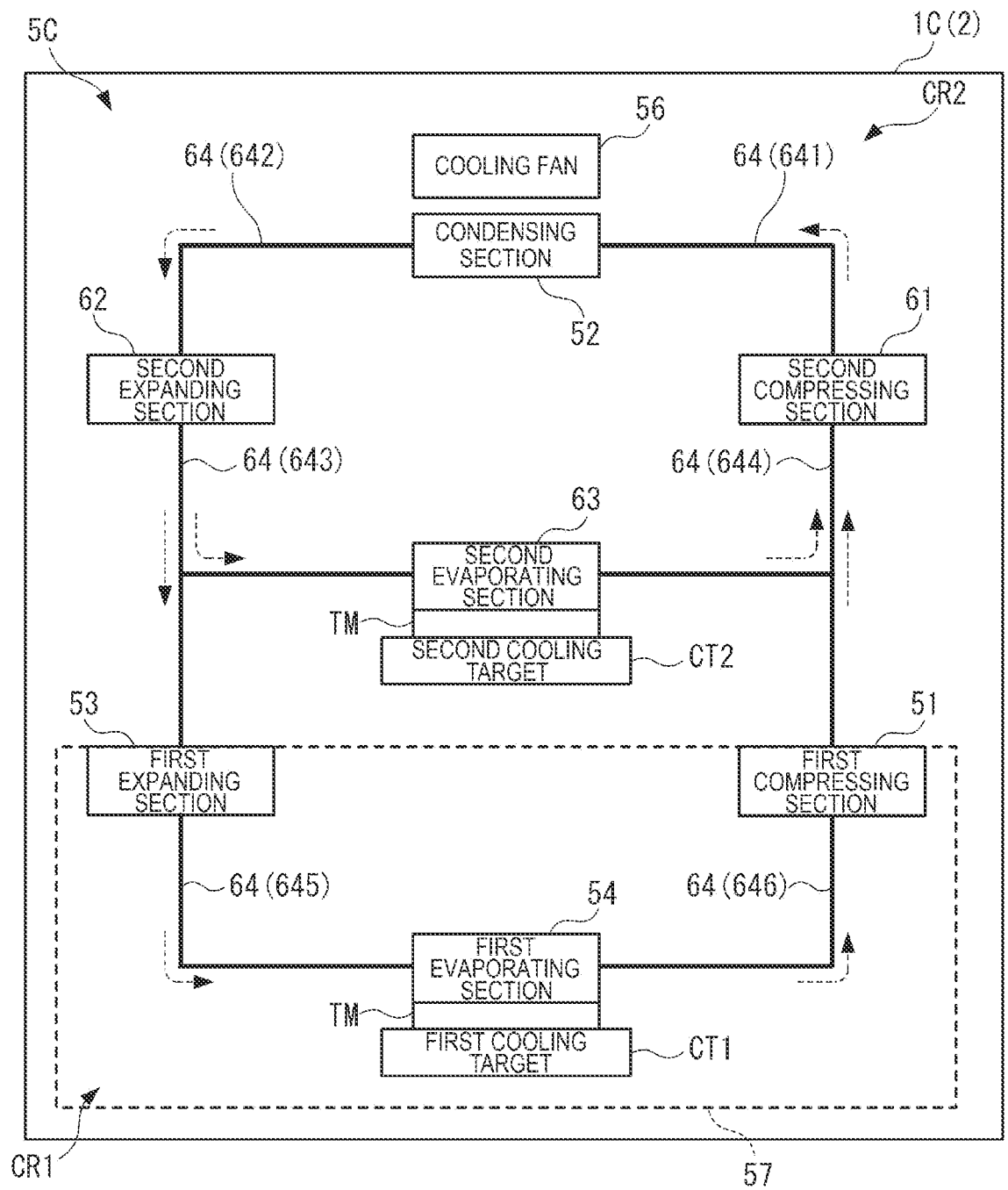
FIG. 6 is a schematic diagram showing a cooling device included in a projector according to a third embodiment.

FIG. 6 is a schematic diagram showing a cooling device 5C included in a projector 1C according to this embodiment.

As shown in FIG. 6, the projector 1C according to this embodiment has the same configuration and the same function as the configuration and the function of the projector 1A according to the first embodiment except that the projector 1C includes, instead of the cooling target 5A according to the first embodiment, the cooling device 5C that cools the first cooling target CT1 and the second cooling target CT2. That is, the projector 1C includes the first cooling target CT1 and the second cooling target CT2 different from the first cooling target CT1.

The second cooling target CT2 is disposed on the inside of the exterior housing 2 together with the cooling target 5C. The first cooling target CT1 is, for example, the light source 411. The second cooling target CT2 is, for example, the light modulation devices 343.

The cooling device 5C includes a second compressor 61, a second expander 62, and a second evaporator 63 functioning as components that cool the second cooling target CT2 and a plurality of pipes 64, on the insides of which working fluid flows, besides the first compressor 51, the condenser 52, the first expander 53, the first evaporator 54, the cooling fan 56, and the first case 57.

Configuration of the Plurality of Pipes

The plurality of pipes 64 include a first pipe 641, a second pipe 642, a third pipe 643, a fourth pipe 644, a fifth pipe 645, and a sixth pipe 646.

Like the first pipe 551 according to the first embodiment, the first pipe 641 connects the second compressor 61 and the condenser 52. The second pipe 642 connects the condenser 52 and the second expander 62. The first pipe 641 and the second pipe 642 are formed of a material having relatively high resistance in strength against working fluid having relatively high pressure.

The third pipe 643 is equivalent to a third connection pipe. The third pipe 643 connects the second expander 62 to the first expander 53 and the second evaporator 63. The third pipe 643 leads working fluid discharged from the second expander 62 to the first expander 53 and the second evaporator 63. A flow rate of the working fluid flowing into the first expander 53 via the third pipe 643 and a flow rate of the working fluid flowing into the second evaporator 63 may be the same or may be different.

The fourth pipe 644 is equivalent to a fourth connection pipe. The fourth pipe 644 connects the second evaporator 63 to the first compressor 51 and the second compressor 61. The fourth pipe 644 joins the working fluid discharged from the first compressor 51 and the working fluid discharged from the second evaporator 63 and leads the working fluid to the second compressor 61.

The fifth pipe 645 is equivalent to the first connection pipe. The fifth pipe 645 connects the first expander 53 and the first evaporator 54 and leads the working fluid discharged from the first expander 53 to the first evaporator 54.

The sixth pipe 646 is equivalent to the second connection pipe. The sixth pipe 646 connects the first evaporator 54 and the first compressor 51 and leads the working fluid discharged from the first evaporator 54 to the first compressor 51.

With such pipes 64, the working fluid discharged from the condenser 52 flows into the second expander 62 via the second pipe 642. The working fluid discharged from the second expander 62 is divided by the third pipe 643 and flows into the first expander 53 and the second evaporator 63.

The working fluid discharged from the first expander 53 flows into the first evaporator 54 via the fifth pipe 645. The working fluid discharged from the first evaporator 54 flows into the first compressor 51 via the sixth pipe 646.

The working fluid discharged from the second evaporator 63 and the working fluid discharged from the first compressor 51 are joined by the fourth pipe 644 and flow into the second compressor 61. The working fluid discharged from the second compressor 61 flows into the condenser 52 via the first pipe 641.

In this way, the cooling device 5C includes a first circulation path CR1 of the working fluid discharged from the condenser 52, flowing in the second pipe 642, the second expander 62, the third pipe 643, the first expander 53, the fifth pipe 645, the first evaporator 54, the sixth pipe 646, the first compressor 51, the fourth pipe 644, the second compressor 61, and the first pipe 641 in order, and flowing into the condenser 52 again.

The cooling device 5C includes a second circulation path CR2 of the working fluid discharged from the condenser 52, flowing in the second pipe 642, the second expander 62, the third pipe 643, the second evaporator 63, the fourth pipe 644, the second compressor 61, and the first pipe 641 in order, and flowing into the condenser 52 again.

Configurations of the Second Expander, the Second Evaporator, and the Second Compressor The second expander 62 functions in the same manner as the first expander 53 according to the first embodiment. The second expander 62 is a decompressor. Working fluid in a liquid phase flows into the second expander 62 from the condenser 52 via the second pipe 642. The second expander 62 decompresses the working fluid in the liquid phase condensed by the condenser 52 and changes the working fluid in the liquid phase to the working fluid in a mixed phase of the liquid phase and a gas phase.

The second evaporator 63 functions in the same manner as the first evaporator 54 in the cooling device 5A. The working fluid in the liquid phase flows into the second evaporator 63 from the first expander 53 via the third pipe 643. The second evaporator 63 evaporates the working fluid decompressed by the second expander 62 with heat transferred from the second cooling target CT2 connected via the heat transfer member TM to be capable of transferring heat and changes the working fluid to the working fluid in the gas phase. Consequently, the heat of the second cooling target CT2 is consumed and the second cooling target CT2 is cooled.

The second compressor 61 functions in the same manner as the first compressor 51 in the cooling device 5A. The second compressor 61 compresses the working fluid in the gas phase flowing into the second compressor 61 from the second evaporator 63 and the first compressor 51 via the fourth pipe 644. The second compressor 61 discharges the compressed working fluid to the condenser 52 via the first pipe 641.

Configurations of the First Expander and the First Evaporator

In the cooling device 5C, the first expander 53 is connected to the condenser 52 via the second pipe 642, the second expander 62, and the third pipe 643. The first expander 53 further decompresses the working fluid in the liquid phase flowing into the first expander 53 from the second expander 62 via the third pipe 643 and changes the working fluid in the liquid phase to the working fluid in the mixed phase of the liquid phase and the gas phase. That is, the first expander 53 further lowers the temperature of the working fluid flowing into the first expander 53 from the second expander 62.

The first evaporator 54 is connected to the first expander 53 via the fifth pipe 645. The first evaporator 54 evaporates the working fluid in the liquid phase caused to flow in from the first expander 53 with heat transferred from the first cooling target CT1 connected via the heat transfer member TM to be capable of transferring heat and changes the working fluid in the liquid phase to the working fluid in the gas phase. Consequently, the heat of the first cooling target CT1 is consumed and the first cooling target CT1 is cooled. The first evaporator 54 discharges the changed working fluid in the gas phase to the first compressor 51 via the sixth pipe 646.

Configuration of the First Compressor

The first compressor 51 compresses the working fluid in the gas phase flowing into the first compressor 51 from the first evaporator 54 via the sixth pipe 646. The first compressor 51 discharges the compressed working fluid to the second compressor 61 via the fourth pipe 644.

The first compressor 51 in the cooling device 5C compresses the working fluid in the gas phase flowing into the first compressor 51 from the first evaporator 54 such that the pressure of the working fluid in the gas phase flowing into the fourth pipe 644 from the first compressor 51 is substantially the same as the pressure of the working fluid in the gas phase flowing into the fourth pipe 644 from the second evaporator 63. Consequently, it is possible to join the working fluid in the gas phase flowing into the fourth pipe 644 from the first compressor 51 and the working fluid in the gas phase flowing into the fourth pipe 644 from the second evaporator 63 and cause the working fluid in the gas phase to easily flow into the second compressor 61.

A driving frequency of the first compressor 51 and a driving frequency of the second compressor 61 are substantially the same. Consequently, by shifting phases of the driving frequencies by a half cycle and driving the first compressor 51 and the second compressor 61, it is possible to suppress noise occurring in the compressors 51 and 61 from increasing. The driving frequency of the first compressor 51 and the driving frequency of the second compressor 61 being substantially the same includes the driving frequencies being the same.

Configuration of the First Case

In the cooling device 5C as well, the first case 57 seals up and houses the first expander 53, the first evaporator 54, the first compressor 51, the fifth pipe 645, and the sixth pipe 646 on the inside. The fifth pipe 645 is equivalent to the first connection pipe. The sixth pipe 646 is equivalent to the second connection pipe.

The temperature of the working fluid discharged from the first expander 53 and flowing into the first evaporator 54 via the fifth pipe 645 is lower than the temperature of the working fluid discharged from the second expander 62 and flowing into the second evaporator 63 via the third pipe 643. The temperature of the working fluid discharged from the second expander 62 and flowing into the second evaporator 63 via the third pipe 643 is lower than the temperature of the working fluid discharged from the second compressor 61 and flowing into the second expander 62 via the condenser 52. Accordingly, dew condensation is easily caused in the first expander 53, the fifth pipe 645, and the first evaporator 54 by the low-temperature working fluid flowing into the first evaporator 54 from the first expander 53.

In contrast, in the cooling device 5C, since the components on a channel of the working fluid from the first expander 53 to the first compressor 51 are sealed up and housed in the first case 57, occurrence of dew condensation is suppressed.

In the cooling device 5C as well, the first compressor 51 may not be sealed up and housed on the inside of the first case 57.

Effects of the Third Embodiment

The projector 1C according to this embodiment explained above achieves effects described below besides the same effects as the effects of the projector 1A according to the first embodiment.

The projector 1C includes the second cooling target CT2 that is disposed in the exterior housing 2 and different from the first cooling target CT1.

The cooling device 5C includes the second compressor 61, the second expander 62, the second evaporator 63, the third pipe 643, and the fourth pipe 644. The third pipe 643 is equivalent to the third connection pipe. The fourth pipe 644 is equivalent to the fourth connection pipe. The second expander 62 decompresses the working fluid in the liquid phase condensed by the condenser 52 and changes the working fluid in the liquid phase to the working fluid in the mixed phase of the liquid phase and the gas phase. The second evaporator 63 changes the working fluid decompressed by the second expander 62 to the working fluid in the gas phase with the heat transferred from the second cooling target CT2. The second compressor 61 compresses the working fluid flowing into the compressor 61 from the second evaporator 63. The third pipe 643 leads the working fluid discharged from the second expander 62 to the second evaporator 63 and the first expander 53. The fourth pipe 644 joins the working fluid discharged from the first compressor 51 and the working fluid in the gas phase discharged from the second evaporator 63 and leads the working fluid to the second compressor 61.

With such a configuration, since the second cooling target CT2 is provided in the exterior housing 2, the projector 1C can be easily set like the projector 1A according to the first embodiment and the projector 1B according to the second embodiment. Besides, the projector 1C can be easily moved.

Since the first cooling target CT1 and the second cooling target CT2 can be cooled by one cooling device 5C, it is unnecessary to provide a cooling device for each of cooling targets. The first circulation path CR1 for cooling the first cooling target CT1 and the second circulation path CR2 for cooling the second cooling target CT2 can share the second compressor 61, the condenser 52, and the second expander 62. Therefore, it is possible to suppress an increase in the size of the projector 1C including the cooling device 5C.

In the projector 1C, the temperature of the working fluid discharged from the second expander 62 and flowing into the second evaporator 63 via the third pipe 643 is lower than the temperature of the working fluid discharged from the second compressor 61 and flowing into the second expander 62 via the condenser 52. The temperature of the working fluid discharged from the first expander 53 and flowing into the first evaporator 54 via the fifth pipe 645 is lower than the temperature of the working fluid discharged from the second expander 62 and flowing into the second evaporator 63 via the third pipe 643. The fifth pipe 645 is equivalent to the first connection pipe. The sixth pipe 646 is equivalent to the second connection pipe.

With such a configuration, since the temperature of the working fluid flowing to the first evaporator 54 is lower than the temperature of the working fluid flowing to the second evaporator 63, when a control temperature of the first cooling target CT1 is lower than a control temperature of the second cooling target CT2, the first cooling target CT1 can be efficiently cooled.

The temperature of the working fluid flowing in the first expander 53, the fifth pipe 645, and the first evaporator 54 is lower than the temperature of the working fluid flowing into the second expander 62 from the second compressor 61 via the condenser 52. Accordingly, dew condensation easily occurs in the first expander 53, the fifth pipe 645, and the first evaporator 54.

In contrast, the first expander 53, the fifth pipe 645, the first evaporator 54, and the sixth pipe 646 are sealed up in the first case 57. Since the humidity in the first case 57 is lower than the humidity of an environment of use of the projector 1C, it is possible to suppress dew condensation from occurring in the first expander 53, the fifth pipe 645, the first evaporator 54, and the sixth pipe 646. Therefore, since the working fluid having lower temperature can be caused to flow to the first evaporator 54, it is possible to improve cooling efficiency of the first cooling target CT1.

Fourth Embodiment

A fourth embodiment of the present disclosure is explained.

A projector according to this embodiment has the same configuration as the configuration of the projector 1C according to the third embodiment. However, the projector is different from the projector 1C in that the first cooling target CT1 is cooled by the cooling gas circulating in the first case 57 as in the cooling device 5B in the projector 1B according to the second embodiment. In the following explanation, the same or substantially the same portions as the portions explained above are denoted by the same reference numerals and signs and explanation of the portions is omitted.

Figure 7:
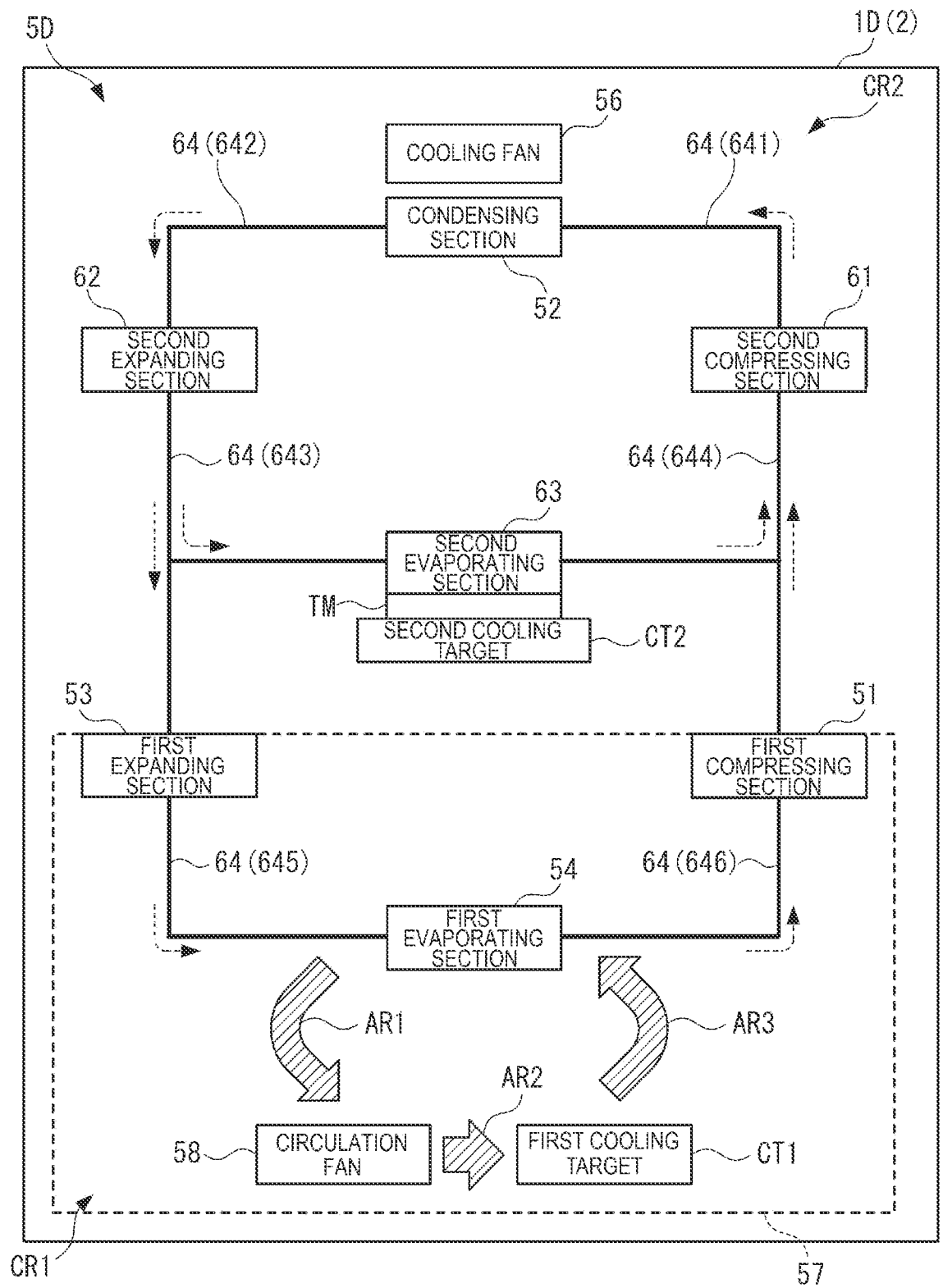
FIG. 7 is a schematic diagram showing a cooling device included in a projector according to a fourth embodiment.

FIG. 7 is a schematic diagram showing a cooling device 5D included in a projector 1D according to this embodiment.

The projector 1D according to this embodiment has the same configuration and the same function as the configuration and the function of the projector 1C according to the third embodiment except that the projector 1D includes the cooling device 5D shown in FIG. 7.

The cooling device 5D has the same configuration as the configuration of the cooling device 5C except that the cooling device 5D includes the circulation fan 58 instead of the heat transfer member TM. The cooling device 5D cools the first cooling target CT1 and the second cooling target CT2. Specifically, the cooling device 5D further includes the first compressor 51, the condenser 52, the first expander 53, the third evaporator 54, the cooling fan 56, the first case 57, the circulation fan 58, the second compressor 61, the second expander 62, the second evaporator 63, and the pipes 64 (641 to 646). The circulation fan 58 is equivalent to the first circulation fan.

The cooling device 5D includes the first circulation path CR1 of working fluid discharged from the condenser 52, flowing in the second pipe 642, the second expander 62, the third pipe 643, the first expander 53, the fifth pipe 645, the first evaporator 54, the sixth pipe 646, the first compressor 51, the fourth pipe 644, the second compressor 61, and the first pipe 641 in order, and, thereafter, flowing into the condenser 52 again.

The cooling device 5D includes the second circulation path CR2 of the working fluid discharged from the condenser 52, flowing in the second pipe 642, the second expander 62, the third pipe 643, the second evaporator 63, the fourth pipe 644, the second compressor 61, and the first pipe 641 in order, and, thereafter, flowing into the condenser 52 again.

In the cooling device 5D, like the first case 57 according to the third embodiment, the first case 57 seals up and houses the first expander 53, the fifth pipe 645, the first evaporator 54, the sixth pipe 646, and the first compressor 51 and the first cooling target CT1 on the inside. The fifth pipe 645 is equivalent to the first connection pipe. The sixth pipe 646 is equivalent to the second connection pipe.

On the inside of the first case 57, as on the inside of the first case 57 according to the second embodiment, a circulation channel of cooling gas circulating in the first case 57 is provided. The cooling gas flowing to the first cooling target CT1 is cooled by the first evaporator 54. That is, as in the circulation channel of the cooling gas in the cooling device 5B, the cooling gas cooled by the first evaporator 54 is sucked by the circulation fan 58 as indicated by the arrow AR1 and, thereafter, delivered to the first cooling target CT1 by the circulation fan 58 as indicated by the arrow AR2. The cooling gas delivered to the first cooling target CT1 flows to the first evaporator 54 as indicated by the arrow AR3 and is cooled by the first evaporator 54. In this way, the first evaporator 54 cools the cooling gas on the inside of the first case 57 and cools the first cooling target CT1. The cooling device 5D cools the first cooling target CT1. However, a cooling target of the first evaporator 54 can also be considered the cooling gas in the first case 57.

In the cooling device 5D as well, the first compressor 51 may not be housed on the inside of the first case 57.

Effects of the Fourth Embodiment

The projector 1D according to this embodiment explained above achieves the same effects as the effects of the projector 1B according to the second embodiment and the same effects as the effects of the projector 1C according to the third embodiment.

Fifth Embodiment

A fifth embodiment of the present disclosure is explained.

A projector according to this embodiment has the same configuration as the configuration of the projector 1C according to the third embodiment but is different in that a sealing range of the first case 57 is enlarged. In the following explanation, the same or substantially the same portions as the portions explained above are denoted by the same reference numerals and signs and explanation of the portions is omitted.

Figure 8:
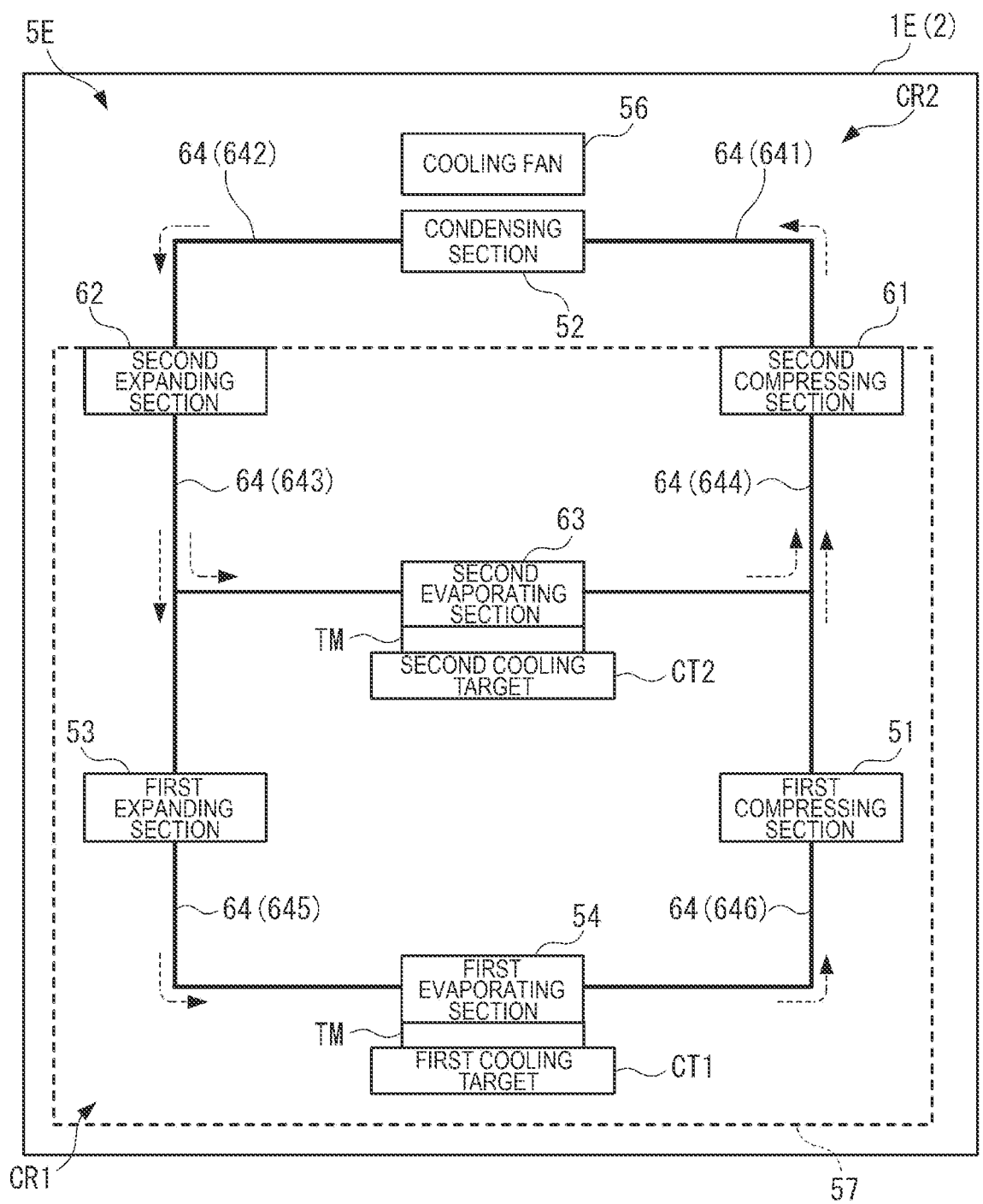
FIG. 8 is a schematic diagram showing a cooling device included in a projector according to a fifth embodiment.

FIG. 8 is a schematic diagram showing a cooling device 5E included in a projector 1E according to this embodiment.

The projector E1 according to this embodiment has the same configuration and the same function as the configuration and the function of the projector 1C according to the third embodiment except that the projector 1E includes the cooling device 5E shown in FIG. 8 instead of the cooling device 5C according to the third embodiment.

Like the cooling device 5C, the cooling device 5E includes the first compressor 51, the condenser 52, the first expander 53, the first evaporator 54, the cooling fan 56, the first case 57, the second compressor 61, the second expander 62, the second evaporator 63, and the plurality of pipes 64 (641 to 646) and includes the first circulation path CR1 and the second circulation path CR2 configured by these components.

In the cooling device 5E, like the first case 57 of the cooling device 5C, the first case 57 seals up and houses the first expander 53, the fifth pipe 645, the first evaporator 54, the sixth pipe 646, and the first compressor 51 on the inside. Besides, the first case 57 seals up and houses the second expander 62, the third pipe 643, the second evaporator 63, the fourth pipe 644, and the second compressor 61 on the inside.

The temperature of the working fluid discharged from the second expander 62 and flowing into the second evaporator 63 via the third pipe 643 is lower than the temperature of the working fluid discharged from the second compressor 61 and flowing into the second expander 62 via the first pipe 641, the condenser 52, and the second pipe 642.

The temperature of the working fluid discharged from the first expander 53 and flowing into the first evaporator 54 via the fifth pipe 645 is lower than the temperature of the working fluid discharged from the second expander 62 and flowing into the second evaporator 63 via the third pipe 643.

Consequently, by sealing up and housing, in the first case 57, among constituent members of the cooling device 5E, constituent members other than constituent members in which the working fluid flowing into the second expander 62 via the first pipe 641, the condenser 52, and the second pipe 642 and having relatively high temperature flows, it is possible to suppress dew condensation from occurring as explained above.

At least one compressor of the first compressor 51 and the second compressor 61 may not be housed in the first case 57.

Effects of the Fifth Embodiment

The projector 1E according to this embodiment explained above achieves effects described below besides the same effects as the effects of the projector 1C according to the third embodiment.

In the projector 1E, the first case 57 seals up not only the first expander 53, the fifth pipe 645, the first evaporator 54, and the sixth pipe 646 but also the second expander 62, the third pipe 643, the second evaporator 63, and the fourth pipe 644 on the inside. The fifth pipe 645 is equivalent to the first connection pipe. The sixth pipe 646 is equivalent to the second connection pipe. The third pipe 643 is equivalent to the third connection pipe. The fourth pipe 644 is equivalent to the fourth connection pipe.

With such a configuration, it is possible to prevent dew condensation due to flowing of the relatively low-temperature working fluid from easily occurring in the second expander 62, the third pipe 643, the second evaporator 63, and the fourth pipe 644 disposed in the first case 57. Therefore, it is possible to cause the working fluid having lower temperature to flow to the second evaporator 63 while preventing the electronic components from breaking down because moisture caused by the dew condensation adheres to the electronic components. Therefore, it is possible to improve cooling efficiency of the second cooling target CT2, heat of which is consumed by the second evaporator 63.

In the projector 1E, the first case 57 seals up the second compressor 61 on the inside.

With such a configuration, even when the relatively low-temperature working fluid flows to the second compressor 61, it is possible to suppress dew condensation from occurring in the second compressor 61.

In the projector 1E, the temperature of the working fluid discharged from the second expander 62 and flowing into the second evaporator 63 via the third pipe 643 is lower than the temperature of the working fluid discharged from the second compressor 61 and flowing into the second expander 62 via the condenser 52. The temperature of the working fluid discharged from the first expander 53 and flowing into the first evaporator 54 via the fifth pipe 645 is lower than the temperature of the working fluid discharged from the second expander 62 and flowing into the second evaporator 63 via the third pipe 643.

With such a configuration, when a control temperature of the first cooling target CT1 is lower than a control temperature of the second cooling target CT2, the first cooling target CT1 can be efficiently cooled by the first evaporator 54 in which the working fluid having temperature lower than the temperature of the working fluid flowing to the second evaporator 63 flows.

Since the humidity in the first case 57 is lower than the humidity of an environment of use of the projector 1E, it is possible to suppress dew condensation from occurring in the first expander 53, the fifth pipe 645, the first evaporator 54, and the sixth pipe 646. Therefore, since the working fluid having lower temperature can be caused to flow to the first evaporator 54, it is possible to improve cooling efficiency of the first cooling target CT1.

On the other hand, the temperature of the working fluid flowing in the second expander 62, the third pipe 643, and the second evaporator 63 is lower than the temperature of the working fluid flowing into the second expander 62 from the second compressor 61 via the condenser 52. Accordingly, depending on the temperature of the working fluid discharged from the second expander 62, it is likely that dew condensation occurs in the second expander 62, the third pipe 643, and the second evaporator 63.

In contrast, the second expander 62, the third pipe 643, the second evaporator 63, and the fourth pipe 644 are sealed up in the first case 57. Since the humidity in the first case 57 is lower than the humidity of the environment of use of the projector 1E, it is possible to suppress dew condensation from occurring in the second expander 62, the third pipe 643, the second evaporator 63, and the fourth pipe 644. Therefore, since the working fluid having lower temperature can be caused to flow to the second evaporator 63, it is possible to improve cooling efficiency of the second cooling target CT2.

Sixth Embodiment

A sixth embodiment of the present disclosure is explained.

A projector according to this embodiment has the same configuration as the configuration of the projector 1E according to the fifth embodiment but is different in that each of the first cooling target CT1 and the second cooling target CT2 provided in the first case 57 is cooled by a cooling gas circulating in the first case 57. In the following explanation, the same or substantially the same portions as the portions explained above are denoted by the same reference numerals and signs and explanation of the portions is omitted.

Figure 9:
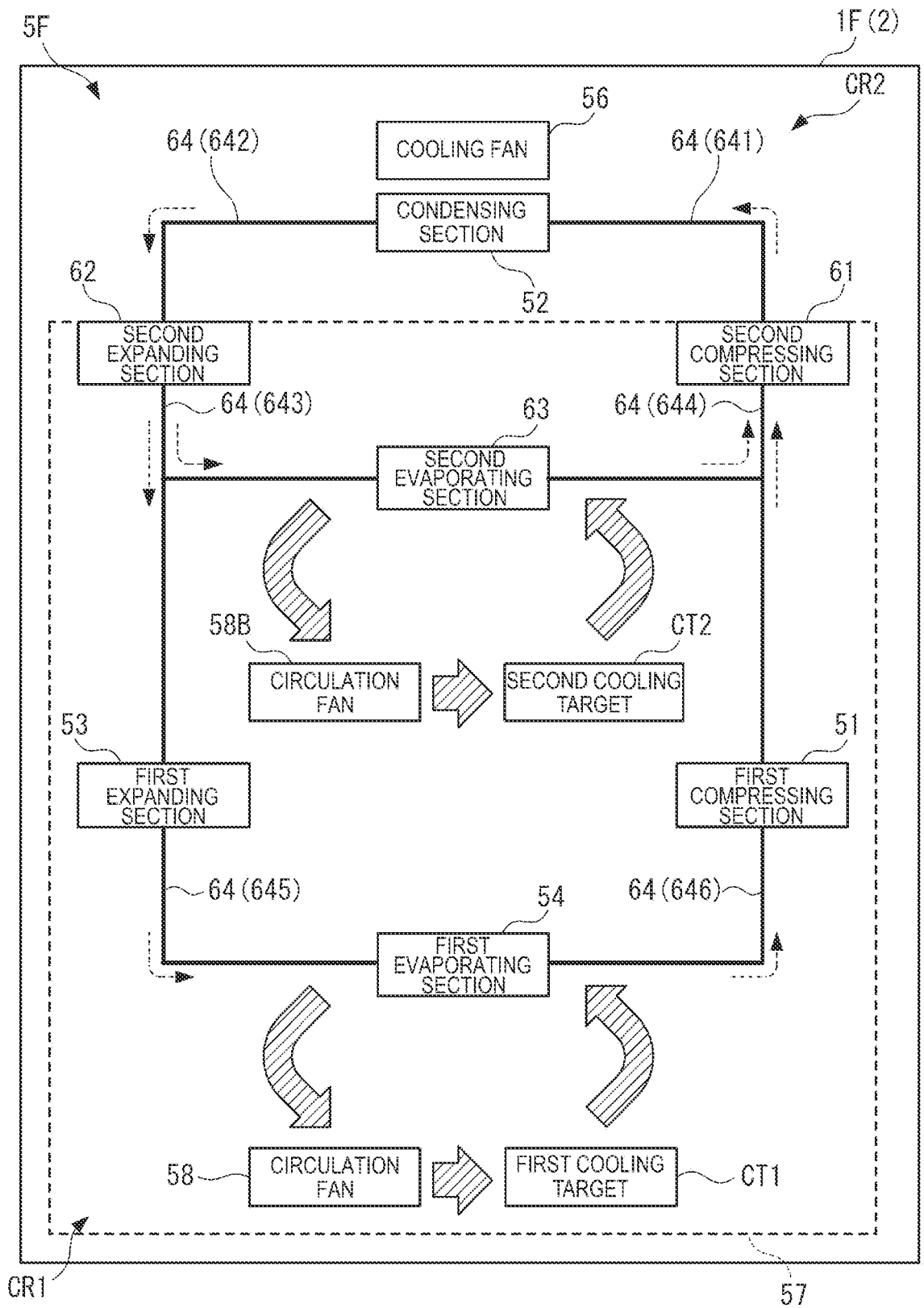
FIG. 9 is a schematic diagram showing a cooling device included in a projector according to a sixth embodiment.

FIG. 9 is a schematic diagram showing a cooling device 5F included in a projector 1F according to this embodiment.

The projector 1F according to this embodiment has the same configuration and the same function as the configuration and the function of the projector 1E according to the fifth embodiment except that the projector 1F includes the cooling device 5F shown in FIG. 9 instead of the cooling device 5E.

The cooling device 5F has the same configuration and the same function as the configuration and the function of the cooling device 5E according to the fifth embodiment except that a circulation channel of a cooling gas for cooling the first cooling target CT1 and a circulation channel of a cooling gas for cooling the second cooling target CT2 are provided in the first case 57. That is, the cooling device 5F has the same configuration and the same function as the configuration and the function of the cooling device 5E except that the cooling device 5F includes circulation fans 58 and 58B instead of the heat transfer member TM connecting the first evaporator 54 and the first cooling target CT1 and the heat transfer member TM connecting the second evaporator 63 and the second cooling target CT2.

In the cooling device 5F, the first case 57 seals up and houses the second expander 62, the third pipe 643, the second evaporator 63, the fourth pipe 644, and the second compressor 61 on the inside in addition to sealing up and housing the first expander 53, the fifth pipe 645, the first evaporator 54, the sixth pipe 646, and the first compressor 51 on the inside. The first case 57 seals up and houses the first cooling target CT1, the second cooling target CT2, and the circulation fans 58 and 58B on the inside.

The circulation fan 58 is equivalent to the first circulation fan. The circulation fan 58 circulates the cooling gas on the inside of the first case 57 to cool the first cooling target CT1. Specifically, the circulation fan 58 sucks the cooling gas cooled by the first evaporator 54 in the cooling gas in the first case 57 and delivers the cooling gas to the first cooling target CT1 to thereby cool the first cooling target CT1. The cooling gas having cooled the first cooling target CT1 flows to the first evaporator 54 and is cooled by the first evaporator 54 and sucked by the circulation fan 58 again.

The circulation fan 58B circulates the cooling gas on the inside of the first case 57 to cool the second cooling target CT2. Specifically, the circulation fan 58B sucks the cooling gas cooled by the second evaporator 63 in the cooling gas in the first case 57 and delivers the cooling gas to the second cooling target CT2 to thereby cool the second cooling target CT2. The cooling gas having cooled the second cooling target CT2 flows to the second evaporator 63 and is cooled by the second evaporator 63 and sucked by the circulation fan 58B again.

Effects of the Sixth Embodiment

The projector 1F according to this embodiment explained above achieves effects describe below besides the same effects as the effects of the projector 1E according to the fifth embodiment.

In the projector 1F, the second cooling target CT2 is disposed on the inside of the first case 57. The second evaporator 63 cools the cooling gas on the inside of the first case 57 and cools the second cooling target CT2.

With such a configuration, since the second cooling target CT2 is sealed up in the first case 57, it is possible to suppress dust and the like from adhering to the second cooling target CT2. The entire second cooling target CT2 can be cooled by the cooling gas cooled by the second evaporator 63 in the first case 57. Besides, when the second cooling target CT2 includes a plurality of components, for example, when the second cooling target CT2 is the light modulation device for red light 343R, the light modulation device for green light 343G, and the light modulation device for blue light 343B, the configuration of the cooling device 5F can be further simplified compared with when the second evaporator 63 is provided in each of the plurality of components.

In the projector 1F, the cooling device 5F includes the circulation fan 58B that is provided on the inside of the first case 57 and circulates the cooling gas on the inside of the first case 57 to cool the second cooling target CT2. The circulation fan 58B is equivalent to the second circulation fan.

With such a configuration, it is possible to cause the cooling gas circulated in the first case 57 by the circulation fan 58B and cooled by the second evaporator 63 to flow to the second cooling target CT2. Therefore, it is possible to improve cooling efficiency of the second cooling target CT2.

Seventh Embodiment

A seventh embodiment of the present disclosure is explained. A projector according to this embodiment has the same configuration as the projector 1C according to the third embodiment but is different in that a first case housing the first expander 53 and the like on the inside and a second case housing the second expander 62 and the like on the inside are separately provided. In the following explanation, the same or substantially the same portions as the portions explained above are denoted by the same reference numerals and signs and explanation of the portions is omitted.

Figure 10:
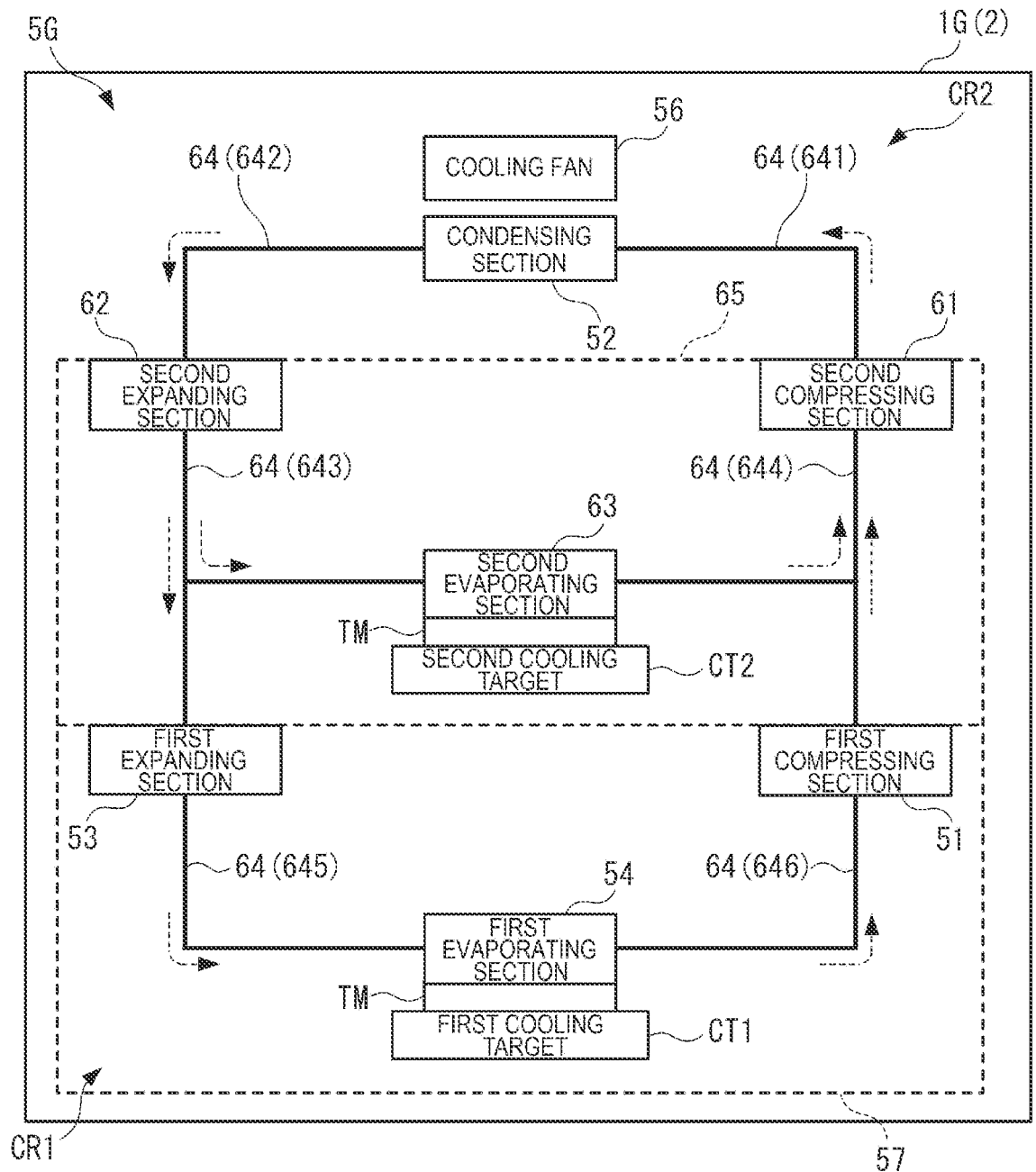
FIG. 10 is a schematic diagram showing a cooling device included in a projector according to a seventh embodiment.

FIG. 10 is a schematic diagram showing a cooling device 5G included in a projector 1G according to this embodiment.

The projector 1G according to this embodiment has the same configuration and the same function as the configuration and the function of the projector 1C according to the third embodiment except that the projector 1G includes the cooling device 5G shown in FIG. 10 instead of the cooling device 5C according to the third embodiment.

The cooling device 5G has the same configuration and the same function as the configuration and the function of the cooling device 5C according to the third embodiment except that the cooling device 5G further includes a second case 65.

In the cooling device 5G, like the first case 57 in the cooling device 5C, the first case 57 seals up and houses the first expander 53, the fifth pipe 645, the first evaporator 54, the sixth pipe 646, and the first compressor 51 and the first cooling target CT1 on the inside. The first evaporator 54 is connected to the first cooling target CT1 via the heat transfer member TM to be capable of transferring heat.

The second case 65 is a sealed housing that seals up and houses the second expander 62, the third pipe 643, the second evaporator 63, the fourth pipe 644, the second compressor 61, and the second cooling target CT2 on the inside. The second case 65 is provided separately from the first case 57. The second evaporator 63 is connected to the second cooling target CT2 via the heat transfer member TM to be capable of transferring heat.

Since the second case 65 is assembled in a facility such as a factory in which humidity is controlled, the humidity in the second case 65 can be set lower than assumed humidity of the environment of use of the projector 1A.

In this way, the second expander 62, the third pipe 643, the second evaporator 63, the fourth pipe 644, and the second compressor 61 in which the working fluid having temperature lower than the temperature of the working fluid flowing from the second compressor 61 to the second expander 62 through the condenser 52 flows are sealed up in the second case 65.

The first expander 53, the fifth pipe 645, the first evaporator 54, the sixth pipe 646, and the first compressor 51 in which the working fluid having temperature lower than the temperature of the working fluid flowing from the second compressor 61 to the second expander 62 through the condenser 52 flows are sealed up in the first case 57.

Consequently, it is possible to suppress dew condensation from occurring in the components disposed in the first case 57 and the components disposed in the second case 65.

In an example of the cooling device 5G shown in FIG. 10, substantially the entirety of the third pipe 643 and the fourth pipe 644 is housed in the second case 65. However, not only this, but at least a part of a region from a dividing point of the working fluid to the first expander 53 in the third pipe 643 may be provided on the outside of the second case 65. At least a part of a region from the first compressor 51 to a joining point of the working fluid in the fourth pipe 644 may be provided on the outside of the second case 65. The first compressor 51 may be provided on the outside of the first case 57. The second compressor 61 may be provided on the outside of the second case 65.

Effects of the Seventh Embodiment

The projector 1G according to this embodiment explained above achieves effects described below besides the same effects as the effects of the projector 1C according to the third embodiment.

In the projector 1G, the cooling device 5G includes the second case 65 that seals up the second expander 62, the third pipe 643, the second evaporator 63, and the fourth pipe 644 on the inside. The third pipe 643 is equivalent to the third connection pipe. The fourth pipe 644 is equivalent to the fourth connection pipe.

With such a configuration, since the humidity in the second case 65 is lower than the humidity of an environment of use of the projector 1G, it is possible to prevent dew condensation due to flowing of the relatively low-temperature working fluid from easily occurring in the second expander 62, the third pipe 643, the second evaporator 63, and the fourth pipe 644 disposed in the second case 65. Therefore, it is possible to cause the working fluid having lower temperature to flow to the second evaporator 63 while preventing the electronic components from breaking down because moisture caused by the dew condensation adheres to the electronic components. Therefore, it is possible to improve cooling efficiency of the second cooling target CT2, heat of which is consumed by the second evaporator 63.

Since the first case 57 and the second case 65 are separated, the first expander 53, the fifth pipe 645, the first evaporator 54, and the sixth pipe 646 can be easily disposed in the first case 57 and the second expander 62, the third pipe 643, the second evaporator 63, and the fourth pipe 644 can be easily disposed in the second case 65. Therefore, the projector 1G can be easily assembled.

In the projector 1G, the second case 65 seals up the second compressor 61 on the inside.

With such a configuration, even when the relatively low-temperature working fluid flows to the second compressor 61, it is possible suppress dew condensation from occurring in the second compressor 61.

In the projector 1G, the temperature of the working fluid discharged from the second expander 62 and flowing into the second evaporator 63 via the third pipe 643 is lower than the temperature of the working fluid discharged from the second compressor 61 and flowing into the second expander 62 via the condenser 52. The temperature of the working fluid discharged from the first expander 53 and flowing into the first evaporator 54 via the fifth pipe 645 is lower than the temperature of the working fluid discharged from the second expander 62 and flowing into the second evaporator 63 via the third pipe 643.

With such a configuration, since the temperature of the working fluid flowing to the first evaporator 54 is lower than the temperature of the working fluid flowing to the second evaporator 63, when a control temperature of the first cooling target CT1 is lower than a control temperature of the second cooling target CT2, the first cooling target CT1 can be efficiently cooled.

Since the humidity in the first case 57 is lower than the humidity of the environment of use of the projector 1E, it is possible to suppress dew condensation from occurring in the first expander 53, the fifth pipe 645, the first evaporator 54, and the sixth pipe 646. Therefore, since the working fluid having lower temperature can be caused to flow to the first evaporator 54, it is possible to improve cooling efficiency of the first cooling target CT1.

On the other hand, the temperature of the working fluid flowing in the second expander 62, the third pipe 643, and the second evaporator 63 is lower than the temperature of the working fluid flowing into the second expander 62 from the second compressor 61 via the condenser 52. Accordingly, depending on the temperature of the working fluid discharged from the second expander 62, it is likely that dew condensation occurs in the second expander 62, the third pipe 643, and the second evaporator 63.

In contrast, the second expander 62, the third pipe 643, the second evaporator 63, and the fourth pipe 644 are sealed up in the second case 65. Since the humidity in the second case 65 is lower than the humidity of the environment of use of the projector 1G, it is possible to suppress dew condensation from occurring in the second expander 62, the third pipe 643, the second evaporator 63, and the fourth pipe 644. Therefore, since the working fluid having lower temperature can be caused to flow to the second evaporator 63, it is possible to improve cooling efficiency of the second cooling target CT2.

Eighth Embodiment

An eighth embodiment of the present disclosure is explained.

A projector according to this embodiment has the same configuration as the configuration of the projector 1G according to the seventh embodiment but is different in that a circulation channel of a cooling gas for cooling the first cooling target CT1 is provided in the first case 57 and a circulation channel of a cooling gas for cooling the second cooling target CT2 in the second case 65 is provided. In the following explanation, the same or substantially the same portions as the portions explained above are denoted by the same reference numerals and signs and explanation of the portions is omitted.

Figure 11:
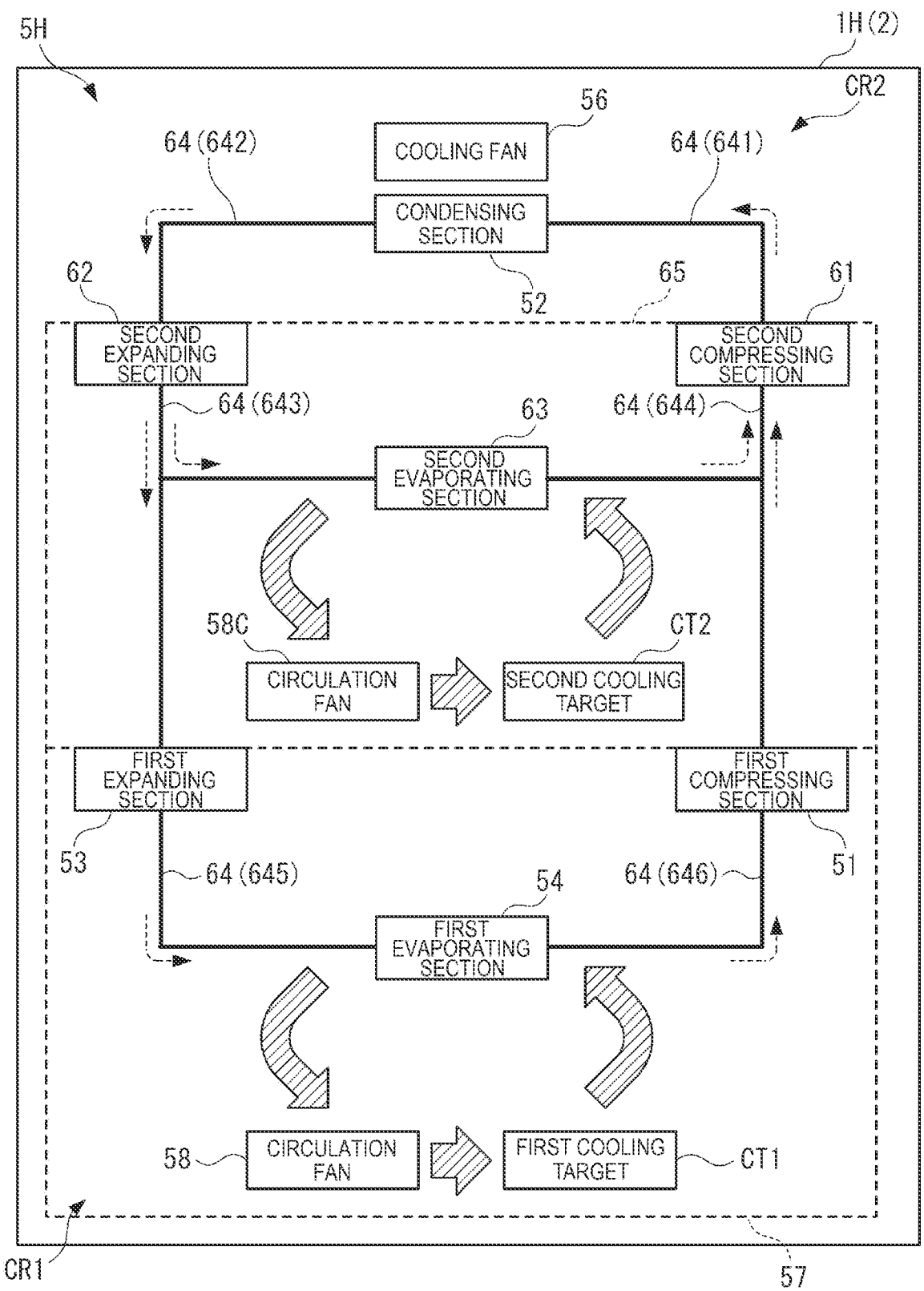
FIG. 11 is a schematic diagram showing a cooling device included in a projector according to an eighth embodiment.

FIG. 11 is a schematic diagram showing a configuration of a cooling device 5H included in a projector 1H according to this embodiment.

The projector 1H according to this embodiment has the same configuration and the same function as the configuration and the function of the projector 1G according to the seventh embodiment except that the projector 1H includes the cooling device 5H shown in FIG. 11 instead of the cooling device 5G according to the seventh embodiment.

The cooling device 5H has the same configuration and the same function as the configuration and the function of the cooling device 5G except that the cooling device 5H includes the circulation fan 58 instead of the heat transfer member TM connecting the first evaporator 54 and the first cooling target CT1 and includes a circulation fan 58C instead of the heat transfer member TM connecting the second evaporator 63 and the second cooling target CT2.

The circulation fan 58C is equivalent to a third circulation fan. The circulation fan 58C is provided in the second case 65 and circulates a cooling gas on the inside of the second case 65 to cool the second cooling target CT2. Specifically, the circulation fan 58C sucks the cooling gas cooled by the second evaporator 63 in the second case 65, delivers the cooling gas to the second cooling target CT2, and cools the second cooling target CT2. The cooling gas having cooled the second cooling target CT2 is cooled by the second evaporator 63 and sucked by the circulation fan 58C again. That is, in the cooling device 5H, a circulation channel of the cooling gas for cooling the second cooling target CT2 is provided in the second case 65. The second evaporator 63 cools the cooling gas on the inside of the second case 65, and cools the second cooling target CT2.

In the first case 57, a circulation channel of the cooling gas circulated by the circulation fan 58 and cooled by the first evaporator 54 and cooling the first cooling target CT1 is provided.

Effects of the Eighth Embodiment

The projector 1H according to this embodiment explained above achieves effects described below besides the same effects as the effects of the projector 1G according to the seventh embodiment.

In the projector 1H, the second cooling target CT2 is disposed on the inside of the second case 65. The second evaporator 63 cools the cooling gas on the inside of the second case 65 and cools the second cooling target CT2.

With such a configuration, since the second cooling target CT2 is sealed up in the second case 65, it is possible to suppress dust and the like from adhering to the second cooling target CT2. Since the second cooling target CT2 is cooled by the cooling gas cooled by the second evaporator 63 in the second case 65, the entire second cooling target CT2 can be cooled by the cooling gas. Besides, when the second cooling target CT2 includes a plurality of components, for example, when the second cooling target CT2 is the light modulation devices 343B, 343G, and 343R, the configuration of the cooling device 5H can be further simplified compared with when the second evaporator 63 is provided in each of the plurality of components.

In the projector 1H, the cooling device 5H includes the circulation fan 58C that is provided on the inside of the second case 65 and circulates the cooling gas on the inside of the second case 65 to cool the second cooling target CT2. The circulation fan 58C is equivalent to the third circulation fan.

With such a configuration, it is possible to cause the cooling gas circulated in the second case 65 by the circulation fan 58C and cooled by the second evaporator 63 to flow to the second cooling target CT2. Therefore, it is possible to improve cooling efficiency of the second cooling target CT2.

Modifications of the Embodiments

The present disclosure is not limited to the embodiments explained above. Modifications, improvements, and the like within a range in which the object of the present disclosure can be achieved are included in the present disclosure.

In the embodiments, the first case 57 seals up the first compressor 51 on the inside. However, not only this, but the first compressor 51 may be provided on the outside of the first case 57.

In the fifth and sixth embodiments, the first case 57 seals up the second compressor 61 on the inside. In the seventh and eighth embodiments, the second case 65 seals up the second compressor 61 on the inside. However, not only this, but the second compressor 61 may be provided on the outside of the first case 57 and the outside of the second case 65.

In the third to eighth embodiments, the working fluid discharged from the condenser 52 flows to the second expander 62. The working fluid discharged from the second evaporator 63 and the working fluid discharged from the first compressor 51 flow into the second compressor 61. That is, the second expander 62 is provided between the condenser 52 and the first expander 53 in the channel of the working fluid. The second compressor 61 is provided between the first compressor 51 and the second evaporator 63 and the condenser 52 in the channel of the working fluid. However, not only this, but the second expander 62 may be provided in a position where the working fluid discharged from the first expander 53 connected to the condenser 52 via the second pipe 642 flows in. The second compressor 61 may be provided in a position where the working fluid flowing in from the second evaporator 63 is discharged to the fourth pipe 644. The first compressor 51 may be provided in a position where the working fluid discharged from the second compressor 61 and the working fluid discharged from the first evaporator 54 flows in via the fourth pipe 644. That is, in the cooling devices 5C to 5G, the first expander 53 and the second expander 62 may be interchanged, the first evaporator 54 and the second evaporator 63 may be interchanged, and the first compressor 51 and the second compressor 61 may be interchanged. In this case as well, the first expander 53, the first evaporator 54, the first connection pipe connecting the first expander 53 and the first evaporator 54, and the second connection pipe connecting the first evaporator 54 and the first compressor 51 only have to be sealed up in the first case 57.

In the first, the third, the fifth, and the seventh embodiments, the first evaporator 54 cools the first cooling target CT1 by transferring, to the working fluid flowing on the inside of the first evaporator 54, the heat of the first cooling target CT1 connected to the first evaporator 54 to be capable of transferring heat. In the second, the fourth, the sixth, and the eighth embodiments, the first evaporator 54 cools the cooling gas flowing to the first cooling target CT1. However, not only this, but the first evaporator 54 may cool the first cooling target CT1 by cooling the liquid coolant flowing to the first cooling target CT1. The same applies to the second evaporator 63 that cools the second cooling target CT2.

In the second, fourth, sixth, and eighth embodiments, the circulation fan 58 is provided in the first case 57. In the sixth embodiment, the circulation fan 58B is provided in the first case 57. In the eighth embodiment, the circulation fan 58C is provided in the second case 65. However, not only this, but such circulation fans may be absent.

In the sixth embodiment, the two circulation fans, that is, the circulation fan 58 and the circulation fan 58B are provided in the first case 57. However, not only this, but the cooling gas in the first case 57 may be circulated by one circulation fan to cool both of the first cooling target CT1 and the second cooling target CT2. Two circulation fans may be provided in the first case 57 and the cooling gas in the first case 57 may be circulated by the two circulation fans to cool both of the first cooling target CT1 and the second cooling target CT2. Further, three or more fans may be provided in the first case 57 to cool the first cooling target CT1 and the second cooling target CT2.

In the embodiments, the light source 411, the wavelength conversion element 46, and the light modulation devices 343 are illustrated as the first cooling target CT1 and the second cooling target CT2. However, not only this, but any component of a projector could be the first cooling target CT1 and the second cooling target CT2. For example, one of the first cooling target CT1 and the second cooling target CT2 may be one of the power supply device PS and the control device CD. The first cooling target CT1 may be configured from a plurality of components. The second cooling target CT2 may be configured from a plurality of components. That is, the first cooling target CT1 and the second cooling target CT2 may be any components.

In the embodiments, the first case 57 and the second case 65 are the sealed housings. Dehumidifying elements that discharge moisture on the inside of the cases to the outside of the cases may be provided in the first case 57 and the second case 65. The humidity inside the cases can be maintained low by providing the dehumidifying elements.

In the embodiments, the projectors 1A, 1B, 1C, 1D, 1E, 1F, 1G, and 1H include the image projection device 3 shown in FIG. 2. The image projection device 3 includes the light source device 4 shown in FIG. 3. However, not only this, but the configuration and the layout of the optical components included in the image projection device 3 can be changed as appropriate and the configuration and the layout of the optical components included in the light source device 4 can be changed as appropriate. For example, the wavelength conversion element 46 included in the light source device 4 is a reflection-type wavelength conversion element that emits the fluorescent light YL generated by the wavelength converter 461 to the incident side of the blue light L1s. However, a transmission-type wavelength conversion element that emits fluorescent light along an incident direction of the blue light L1s may be adopted in a light source device.

In the embodiments, the light source 411 of the light source device 4 includes the semiconductor lasers 412 and 413. However, not only this but the light source device 4 may include, as light sources, a light source lamp such as an ultrahigh pressure mercury lamp and other solid-state light sources such as an LED. The light source device 4 may include other solid-state light sources such as an LD and LED and light source lamps that respectively emit red, green, and blue lights. In this case, cooling targets of the cooling devices 5A, 5B, 5C, 5D, 5E, 5F, 5G, and 5H may be the other solid-state light sources and the light source lamps.

In the embodiments, the projectors 1A, 1B, 1C, 1D, 1E, 1F, 1G, and 1H include the three light modulation devices 343 (343B, 343G, and 343R). However, not only this, but the present disclosure is also applicable to a projector including two or less or four or more light modulation devices.

In the embodiments, the light modulation device 343 is the transmission-type liquid crystal panel, a light incident surface and a light emission surface of which are different. However, not only this, but a reflection-type liquid crystal panel, a light incident surface and a light emission surface of which are the same, may be used as a light modulation device. A light modulation device other than liquid crystal, in which a device including a micromirror, for example, a DMD (Digital Micromirror Device) is used, may be used if the light modulation device is a light modulation device capable of modulating an incident light beam and forming an image corresponding to image information.

OVERVIEW OF THE PRESENT DISCLOSURE

An overview of the present disclosure is supplementarily noted below.

A projector according to an aspect of the present disclosure is a projector that modulates light emitted from a light source and projects the light, the projector including: a first cooling target; a cooling device configured to cool the first cooling target; and an exterior housing configuring an exterior of the projector and housing the first cooling target and the cooling device. The cooling device includes: a first compressor configured to compress working fluid in a gas phase; a condenser configured to condense the working fluid in the gas phase compressed by the first compressor into the working fluid in a liquid phase; a first expander configured to decompress the working fluid in the liquid phase condensed by the condenser and change the working fluid in the liquid phase to the working fluid in a mixed phase of the liquid phase and the gas phase; a first evaporator configured to change the working fluid caused to flow in from the first expander to the working fluid in the gas phase with heat transferred from the first cooling target and discharge the changed working fluid in the gas phase to the first compressor; a first connection pipe configured to lead the working fluid discharged from the first expander to the first evaporator; a second connection pipe configured to lead the working fluid discharged from the first evaporator to the first compressor; and a first case configured to seal up the first expander, the first connection pipe, the first evaporator, and the second connection pipe on an inside.

With such a configuration, since the cooling device is provided in the exterior housing together with the first cooling target, the projector can be easily set compared with when a part of the cooling device is provided on the outside of the exterior housing. The external appearance of the projector can be made satisfactory. Besides, the projector can be configured small. The projector can be easily moved.

Further, since the humidity in the first case is lower than the humidity of an environment of use of the projector, it is possible to prevent dew condensation due to flowing of relatively low-temperature working fluid from easily occurring in the first expander, the first connection pipe, the first evaporator, and the second connection pipe disposed in the first case. Therefore, it is possible to cause the working fluid having lower temperature to flow to the first evaporator while preventing electronic components from breaking down because moisture caused by the dew condensation adheres to the electronic components. Therefore, it is possible to improve cooling efficiency of the first cooling target, heat of which is consumed by the first evaporator.

In the aspect, the first case may seal up the first compressor on the inside.

With such a configuration, even when the relatively low-temperature working fluid flows to the first compressor, it is possible to suppress dew condensation from occurring in the first compressor.

In the aspect, the first cooling target may be disposed on the inside of the first case, and the first evaporator may cool a cooling gas on the inside of the first case to cool the first cooling target.

With such a configuration, since the first cooling target is sealed up in the first case, it is possible to suppress dust and the like from adhering to the first cooling target. It is possible to cool the entire first cooling target with the cooling gas cooled by the first evaporator in the first case. Besides, when the first cooling target includes a plurality of components, the configuration of the cooling device can be further simplified compared with when the first evaporator is provided in each of the plurality of components.

In the aspect, the cooling device may include a first circulation fan provided on the inside of the first case and configured to circulate a cooling gas on the inside of the first case to cool the first cooling target.

With such a configuration, it is possible to cause the cooling gas circulated in the first case by the first circulation fan and cooled by the first evaporator to flow to the first cooling target. Therefore, it is possible to improve cooling efficiency of the first cooling target.

In the aspect, temperature of the working fluid discharged from the first expander and flowing into the first compressor via the first connection pipe, the first evaporator, and the second connection pipe may be lower than temperature of the working fluid discharged from the first compressor and flowing into the first expander via the condenser, and the first expander, the first connection pipe, the first evaporator, and the second connection pipe on a low temperature side may be disposed on the inside of the first case.

With such a configuration, since the first expander, the first connection pipe, the first evaporator, and the second connection pipe on the low temperature side are disposed on the inside of the first case, it is possible to effectively suppress occurrence of dew condensation.

In the aspect, the projector may further include a second cooling target disposed in the exterior housing and different from the first cooling target, and the cooling device may include: a second expander configured to decompress the working fluid in the liquid phase condensed by the condenser and change the working fluid in the liquid phase to the working fluid in the mixed phase of the liquid phase and the gas phase; a second evaporator configured to change the working fluid decompressed by the second expander to the working fluid in the gas phase with heat transferred from the second cooling target; a second compressor configured to compress the working fluid flowing into the second compressor from the second evaporator; a third connection pipe configured to lead the working fluid discharged from the second expander to the second evaporator and the first expander; and a fourth connection pipe configured to join the working fluid discharged from the first compressor and the working fluid in the gas phase discharged from the second evaporator and lead the working fluid to the second compressor.

With such a configuration, since the second cooling target is provided in the exterior housing, as explained above, the projector can be easily set. Besides, the projector can be easily moved.

Since the first cooling target and the second cooling target can be cooled by one cooling device, it is unnecessary to provide the cooling device for each of the cooling targets. A circulation path for cooling the first cooling target and a circulation path for cooling the second cooling target can share the second compressor, the condenser, and the second expander. Therefore, it is possible to suppress an increase in the size of the projector including the cooling device.

In the aspect, the first case may seal up the second expander, the third connection pipe, the second evaporator, and the fourth connection pipe on the inside.

With such a configuration, it is possible to prevent dew condensation due to flowing of relatively low-temperature working fluid from easily occurring in the second expander, the third connection pipe, the second evaporator, and the fourth connection pipe disposed in the first case. Therefore, it is possible to cause the working fluid having lower temperature to flow to the second evaporator while preventing electronic components from breaking down because moisture caused by the dew condensation adheres to the electronic components. Therefore, it is possible to improve cooling efficiency of the second cooling target, heat of which is consumed by the second evaporator.

In the aspect, the first case may seal up the second compressor on the inside.

With such a configuration, even when the relatively low-temperature working fluid flows to the second compressor, it is possible to suppress dew condensation from occurring in the second compressor.

In the aspect, the second cooling target may be disposed on the inside of the first case, and the second evaporator may cool a cooling gas on the inside of the first case and cool the second cooling target.

With such a configuration, since the second cooling target is sealed up in the first case, it is possible to suppress dust and the like from adhering to the second cooling target.

Since the second cooling target is cooled by the cooling gas cooled by the second evaporator in the first case, the entire second cooling target can be cooled by the cooling gas. Besides, when the second cooling target includes a plurality of components, the configuration of the cooling device can be further simplified compared with when the second evaporator is provided in each of the plurality of components.

In the aspect, the cooling device may include a second circulation fan provided on the inside of the first case and configured to circulate the cooling gas on the inside of the first case to cool the second cooling target.

With such a configuration, it is possible to cause the cooling gas circulated in the first case by the second circulation fan and cooled by the second evaporator to flow to the second cooling target. Therefore, it is possible to improve cooling efficiency of the second cooling target.

In the aspect, the cooling device may include a second case configured to seal up the second expander, the third connection pipe, the second evaporator, and the fourth connection pipe on an inside.

With such a configuration, by setting the humidity in the second case lower than the humidity of an environment of use of the projector, it is possible to prevent dew condensation due to flowing of relatively low-temperature working fluid from easily occurring in the second expander, the third connection pipe, the second evaporator, and the fourth connection pipe disposed in the second case. Therefore, it is possible to cause the working fluid having lower temperature to flow to the second evaporator while preventing electronic components from breaking down because moisture caused by the dew condensation adheres to the electronic components. Therefore, it is possible to improve cooling efficiency of the second cooling target, heat of which is consumed by the second evaporator.

By separating the first case and the second case, the first expander, the first connection pipe, the first evaporator, and the second connection pipe can be easily disposed in the first case and the second expander, the third connection pipe, the second evaporator, and the fourth connection pipe can be easily disposed in the second case. Therefore, the projector can be easily assembled.

In the aspect, the second case may seal up the second compressor on the inside.

With such a configuration, even when the relatively low-temperature working fluid flows to the second compressor, it is possible to suppress dew condensation from occurring in the second compressor.

In the aspect, the second cooling target may be disposed on the inside of the second case, and the second evaporator may cool a cooling gas on the inside of the second case and cool the second cooling target.

With such a configuration, since the second cooling target is sealed up in the second case, it is possible to suppress dust and the like from adhering to the second cooling target. Since the second cooling target is cooled by the cooling gas cooled by the second evaporator in the second case, it is possible to cool the entire second cooling target with the cooling gas. Besides, when the second cooling target includes a plurality of components, the configuration of the cooling device can be further simplified compared with when the second evaporator is provided in each of the plurality of components.

In the aspect, the cooling device may include a third circulation fan provided on the inside of the second case and configured to circulate a cooling gas on the inside of the second case to cool the second cooling target.

With such a configuration, it is possible to cause the cooling gas circulated in the second case by the third circulation fan and cooled by the second evaporator to flow to the second cooling target. Therefore, it is possible to improve cooling efficiency of the second cooling target.

In the aspect, temperature of the working fluid discharged from the second expander and flowing into the second evaporator via the third connection pipe may be lower than temperature of the working fluid discharged from the second compressor and flowing into the second expander via the condenser, and temperature of the working fluid discharged from the first expander and flowing into the first evaporator via the first connection pipe may be lower than temperature of the working fluid discharged from the second expander and flowing into the second evaporator via the third connection pipe.

With such a configuration, since the temperature of the working fluid flowing to the first evaporator is lower than the temperature of the working fluid flowing to the second evaporator, when a control temperature of the first cooling target is lower than a control temperature of the second cooling target, the first cooling target can be efficiently cooled.

Since the temperature of the working fluid flowing in the first expander, the first connection pipe, and the first evaporator is lower than the temperature of the working fluid flowing into the second expander from the second compressor via the condenser, dew condensation easily occurs in the first expander, the first connection pipe, and the first evaporator.

In contrast, the first expander, the first connection pipe, the first evaporator, and the second connection pipe are sealed up in the first case. Since the humidity in the first case is lower than the humidity of an environment of use of the projector, it is possible to suppress dew condensation from occurring in the first expander, the first connection pipe, the first evaporator, and the second connection pipe. Therefore, since the working fluid having lower temperature can be caused to flow to the first evaporator, it is possible to improve cooling efficiency of the first cooling target.

Further, the temperature of the working fluid flowing in the second expander, the third connection pipe, and the second evaporator is lower than the temperature of the working fluid flowing into the second expander from the second compressor via the condenser. Therefore, depending on the temperature of the working fluid discharged from the second expander, it is likely that dew condensation occurs in the second expander, the third connection pipe, and the second evaporator.

In contrast, when the second expander, the third connection pipe, the second evaporator, and the fourth connection pipe are sealed up in the first case or the second case, since the humidity in the first case and the humidity in the second case are lower than the humidity of the environment of use of the projector, it is possible to suppress dew condensation from occurring in the second expander, the third connection pipe, the second evaporator, and the fourth connection pipe. Therefore, since the working fluid having lower temperature can be caused to flow to the second evaporator, it is possible to improve cooling efficiency of the second cooling target.

What is claimed is:

1. A projector that modulates light emitted from a light source and projects the light, the projector comprising:
   a first cooling target;
   a cooling device configured to cool the first cooling target; and
   an exterior housing configuring an exterior of the projector and housing the first cooling target and the cooling device, wherein
   the cooling device includes:
   a first compressor configured to compress working fluid in a gas phase;
   a condenser configured to condense the working fluid in the gas phase compressed by the first compressor into the working fluid in a liquid phase;
   a first expander configured to decompress the working fluid in the liquid phase condensed by the condenser and change the working fluid in the liquid phase to the working fluid in a mixed phase of the liquid phase and the gas phase;

a first evaporator configured to change the working fluid flowing from the first expander to the working fluid in the gas phase with heat transferred from the first cooling target and discharge the working fluid changed in the gas phase to the first compressor;

a first connection pipe configured to lead the working fluid discharged from the first expander to the first evaporator;

a second connection pipe configured to lead the working fluid discharged from the first evaporator to the first compressor; and a first case configured to seal the first expander, the first connection pipe, the first evaporator, and the second connection pipe on an inside.

2. The projector according to claim 1, wherein the first case further seals the first compressor on the inside.

3. The projector according to claim 1, wherein
the first cooling target is disposed on the inside of the first case, and
the first evaporator cools a cooling gas on the inside of the first case and cools the first cooling target.

4. The projector according to claim 3, wherein the cooling device includes a first circulation fan provided on the inside of the first case and configured to circulate a cooling gas on the inside of the first case to cool the first cooling target.

5. The projector according to claim 1, wherein
a temperature of the working fluid discharged from the first expander and flowing into the first compressor via the first connection pipe, the first evaporator, and the second connection pipe is lower than a temperature of the working fluid discharged from the first compressor and flowing into the first expander via the condenser, and
the first expander, the first connection pipe, the first evaporator, and the second connection pipe on a low temperature side are disposed on the inside of the first case.

6. The projector according to claim 1, further comprising a second cooling target disposed in the exterior housing and different from the first cooling target, wherein
the cooling device includes:
a second expander configured to decompress the working fluid in the liquid phase condensed by the condenser and change the working fluid in the liquid phase to the working fluid in the mixed phase of the liquid phase and the gas phase;

a second evaporator configured to change the working fluid decompressed by the second expander to the working fluid in the gas phase with heat transferred from the second cooling target;

a second compressor configured to compress the working fluid flowing into the second compressor from the second evaporator;

a third connection pipe configured to lead the working fluid discharged from the second expander to the second evaporator and the first expander; and a fourth connection pipe configured to join the working fluid discharged from the first compressor and the working fluid in the gas phase discharged from the second evaporator and lead the working fluid to the second compressor.

7. The projector according to claim 6, wherein the first case seals up the second expander, the third connection pipe, the second evaporator, and the fourth connection pipe on the inside.

8. The projector according to claim 7, wherein the first case further seals the second compressor on the inside.

9. The projector according to claim 7, wherein
the second cooling target is disposed on the inside of the first case, and
the second evaporator cools a cooling gas on the inside of the first case and cools the second cooling target.

10. The projector according to claim 9, wherein the cooling device includes a second circulation fan provided on the inside of the first case and configured to circulate the cooling gas on the inside of the first case to cool the second cooling target.

11. The projector according to claim 6, wherein the cooling device includes a second case configured to seal the second expander, the third connection pipe, the second evaporator, and the fourth connection pipe on an inside.

12. The projector according to claim 11, wherein the second case further seals the second compressor on the inside.

13. The projector according to claim 11, wherein
the second cooling target is disposed on the inside of the second case, and
the second evaporator cools a cooling gas on the inside of the second case and cools the second cooling target.

14. The projector according to claim 13, wherein the cooling device includes a third circulation fan provided on the inside of the second case and configured to circulate a cooling gas on the inside of the second case to cool the second cooling target.

* * * * *